(12) United States Patent
Yamada

(10) Patent No.: US 9,257,959 B2
(45) Date of Patent: Feb. 9, 2016

(54) RESONATOR ELEMENT, RESONATOR, OSCILLATOR, ELECTRONIC APPARATUS, SENSOR, AND MOVING OBJECT

(71) Applicant: SEIKO EPSON CORPORATION, Tokyo (JP)

(72) Inventor: Akinori Yamada, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/220,656

(22) Filed: Mar. 20, 2014

(65) Prior Publication Data

US 2014/0292431 A1 Oct. 2, 2014

(30) Foreign Application Priority Data

Mar. 29, 2013 (JP) .................................. 2013-075412
Feb. 6, 2014 (JP) .................................. 2014-021140

(51) Int. Cl.
| | | |
|---|---|---|
| *H03B 5/32* | (2006.01) | |
| *H03H 9/215* | (2006.01) | |
| *H03H 9/125* | (2006.01) | |
| *H03H 9/05* | (2006.01) | |
| *H03H 9/10* | (2006.01) | |

(52) U.S. Cl.
CPC ............. *H03H 9/125* (2013.01); *H03H 9/0547* (2013.01); *H03H 9/1021* (2013.01); *H03B 5/32* (2013.01)

(58) Field of Classification Search
CPC ............. G04F 5/04; G04F 5/06; G04F 5/063; H03B 5/30; H03B 5/32; H03H 9/21; H03H 9/215; H03H 9/2468; H03H 9/2473; H03H 9/2478; H03H 9/2484; H03H 9/2489; H03H 9/2494; H03H 2003/026; H03H 2003/0492
USPC .......... 310/311, 312, 348, 370; 331/154, 156, 331/158
See application file for complete search history.

(56) References Cited

U.S. PATENT DOCUMENTS

| | | | | |
|---|---|---|---|---|
| 7,368,861 | B2 * | 5/2008 | Tanaya ........................... | 310/370 |
| 8,928,207 | B2 * | 1/2015 | Kawanishi ..................... | 310/370 |
| 2002/0089386 | A1 | 7/2002 | Kitamura et al. | |
| 2006/0186768 | A1 * | 8/2006 | Kawanishi et al. ........... | 310/370 |
| 2006/0284694 | A1 * | 12/2006 | Kawashima ................... | 331/158 |
| 2008/0211350 | A1 | 9/2008 | Tanaya et al. | |
| 2011/0018402 | A1 * | 1/2011 | Kobayashi ..................... | 310/365 |

(Continued)

FOREIGN PATENT DOCUMENTS

| | | |
|---|---|---|
| JP | U-2-32229 | 2/1990 |
| JP | A-2001-185987 | 7/2001 |

(Continued)

*Primary Examiner* — Levi Gannon
(74) *Attorney, Agent, or Firm* — Oliff PLC

(57) ABSTRACT

A resonator element includes a quartz crystal substrate having a base, a pair of vibration arms extending from the base, and a support arm located between the vibration arms and extending from the base in the direction in which the vibration arms extend. Each of the vibration arms has an arm portion and a hammer head provided at the front end of the arm portion. The arm portion has a pair of principal surfaces and a groove that has a bottom and opens through each of the principal surfaces. In the invention, the width of each of bank-shaped portions of each of the principal surfaces that are disposed side by side on opposite sides of the groove along the width direction of the vibration arm perpendicular to the longitudinal direction thereof is set at 6 μm or smaller.

13 Claims, 21 Drawing Sheets

(56) References Cited

U.S. PATENT DOCUMENTS

| | | |
|---|---|---|
| 2011/0062825 A1 | 3/2011 | Kawahara |
| 2011/0063041 A1 * | 3/2011 | Yamada et al. ............... 331/158 |
| 2011/0221311 A1 | 9/2011 | Iwai |
| 2011/0309720 A1 | 12/2011 | Kawahara |

FOREIGN PATENT DOCUMENTS

| | | |
|---|---|---|
| JP | A-2005-210185 | 8/2005 |
| JP | A-2009-164775 | 7/2009 |
| JP | 2009-253622 * | 10/2009 ............... H03H 9/19 |
| JP | A-2010-35221 | 2/2010 |
| JP | A-2010-87573 | 4/2010 |
| JP | A-2010-178064 | 8/2010 |
| JP | A-2010-246126 | 10/2010 |
| JP | A-2011-19159 | 1/2011 |
| JP | A-2011-66566 | 3/2011 |
| JP | A-2011-78134 | 4/2011 |
| JP | A-2011-216924 | 10/2011 |
| JP | A-2012-39226 | 2/2012 |
| JP | A-2012-70451 | 4/2012 |
| JP | A-2013-17207 | 1/2013 |
| JP | A-2013-229733 | 11/2013 |

* cited by examiner

RESONATOR ELEMENT, RESONATOR, OSCILLATOR, ELECTRONIC APPARATUS, SENSOR, AND MOVING OBJECT

BACKGROUND

1. Technical Field

The present invention relates to a resonator element, a resonator, an oscillator, an electronic apparatus, a sensor, and a moving object.

2. Related Art

There is a known resonator element of related art that is made of quartz crystal (see JP-UM-A-2-32229, for example). A resonator element of this type excels in frequency-temperature characteristic and is hence widely used as a reference frequency source or a signal transmission source in a variety of electronic apparatus.

The resonator element described in JP-UM-A-2-32229 is of tuning fork type and includes a base and a pair of vibration arms extending from the base. Each of the vibration arms has a pair of open grooves formed in the upper and lower surfaces of the vibration arm. Each of the vibration arms therefore has a substantially H-like transverse cross-sectional shape. The thus shaped vibration arm can reduce the amount of thermoelastic loss and hence provides an excellent vibrational characteristic. In the related art, however, the shape of a vibration arm, specifically, the shape (including the size) of a portion around the grooves has not been sufficiently studied.

SUMMARY

An advantage of some aspects of the invention is to provide a resonator element that can provide an excellent vibrational characteristic but consumes a small amount of electric power, and a resonator, an oscillator, an electronic apparatus, sensor, and a moving object including the resonator element.

The invention can be implemented as the following application examples.

Application Example 1

A resonator element according to one aspect of the invention includes a base and at least one vibration arm that extends from the base in a first direction in a plan view and has a groove provided in at least one of a pair of principal surfaces that face away from each other and form front and rear surfaces, and in the principal surface of the vibration arm in the plan view, each of a width along a second direction perpendicular to the first direction between one outer edge of the vibration arm and an edge of the groove on the side where the one outer edge is present and a width along the second direction between the other outer edge of the vibration arm and an edge of the groove on the side where the other outer edge is present is 6 μm or smaller.

With this configuration, the Q value of the resonator element can be maintained at a relatively high value and sufficiently lower equivalent series resistance R1 (CI value) at the same time. As a result, a resonator element that provides an excellent vibrational characteristic but consumes a small amount of power can be provided.

Application Example 2

In the resonator element according to the aspect of the invention described above, it is preferable that each of the widths is 1 μm or greater and 3 μm or smaller.

Setting the width at a value within the range described above can further lower R1 (CI value) of the resonator element and hence allows the resonator element to be driven with further reduced power consumption.

Application Example 3 in the resonator element according to the aspect of the invention described above, it is preferable that η expressed by 2t/T is at least 0.6, where t [μm] represents a maximum depth of the groove and T [μm] represents the thickness of the vibration arm.

The thus set depth of the groove or η can increase the area where a drive electrode is formed, whereby R1 (CI value) of the resonator element can be further lowered and hence a resonator element driven at further reduced power consumption can be provided.

Application Example 4

In the resonator element according to the aspect of the invention described above, it is preferable that the thickness of the vibration arm is at least 50 μm.

The thus set thickness of the vibration arm can further lower R1 of the resonator element.

Application Example 5

In the resonator element according to the aspect of the invention described above, it is preferable that the vibration arm includes a weight portion and an arm portion disposed between the weight portion and the base in the plan view.

In the thus configured resonator element, the length of the vibration arm and hence the size of the resonator element can be reduced.

Application Example 6

In the resonator element according to the aspect of the invention described above, it is preferable that the weight portion is an increased width portion that is longer than the arm portion in the second direction.

The increased width portion can sufficiently provide a weight effect, and the weight portion can be formed simultaneously with the arm portion and other constituent portions, whereby the resonator element can be efficiently manufactured.

Application Example 7

In the resonator element according to the aspect of the invention described above, it is preferable that the resonator element further includes a support portion that extends from the base.

Providing the support portion can effectively reduce the amount of leakage of vibration of the resonator element. Further, since no support arm is required to be provided between the vibration arms, the length (width) of the resonator element along the second direction can be reduced.

Application Example 8

In the resonator element according to the aspect of the invention described above, it is preferable that the vibration arm is formed of a pair of vibration arms disposed side by side along the second direction, and that the support portion is disposed between the pair of vibration arms in the plan view and extends from the base along the first direction.

The configuration described above can effectively reduce the amount of leakage of vibration of the resonator element. Further, since no support arm is required to be provided between the vibration arms, the length (width) of the resonator element along the second direction can be reduced.

Application Example 9

In the resonator element according to the aspect of the invention described above, it is preferable that the support portion includes a frame that surrounds at least the base and the vibration arms in the plan view.

The configuration described above allows the resonator element to be fixed, for example, to a base of a package via the frame with precision. The size of the resonator element can therefore be increased, whereby R1 of the resonator element can be further reduced.

Application Example 10

In the resonator element according to the aspect of the invention described above, it is preferable that the base includes a reduced width portion provided on at least one of a first end side and a second end side in the plan view and so configured that the length of the reduced width portion along the second direction decreases continuously or stepwise along the first direction from the inner side toward the outer side of the base.

Providing the base with the reduced width portion can effectively suppress leakage of vibration of the resonator element.

Application Example 11

A resonator according to one aspect of the invention includes the resonator element according to the aspect of the invention described above and a package in which the resonator element is incorporated.

With this configuration, a reliable resonator can be provided.

Application Example 12

An oscillator according to one aspect of the invention includes the resonator element according to the aspect of the invention described above and an oscillation circuit.

With this configuration, a reliable oscillator can be provided.

Application Example 13

An electronic apparatus according to one aspect of the invention includes the resonator element according to the aspect of the invention described above.

With this configuration, a reliable electronic apparatus can be provided.

Application Example 14

A sensor according to one aspect of the invention includes the resonator element according to the aspect of the invention.

With this configuration, a reliable sensor can be provided.

Application Example 15

A moving object according to one aspect of the invention includes the resonator element according to the aspect of the invention described above.

With this configuration, a reliable moving object can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
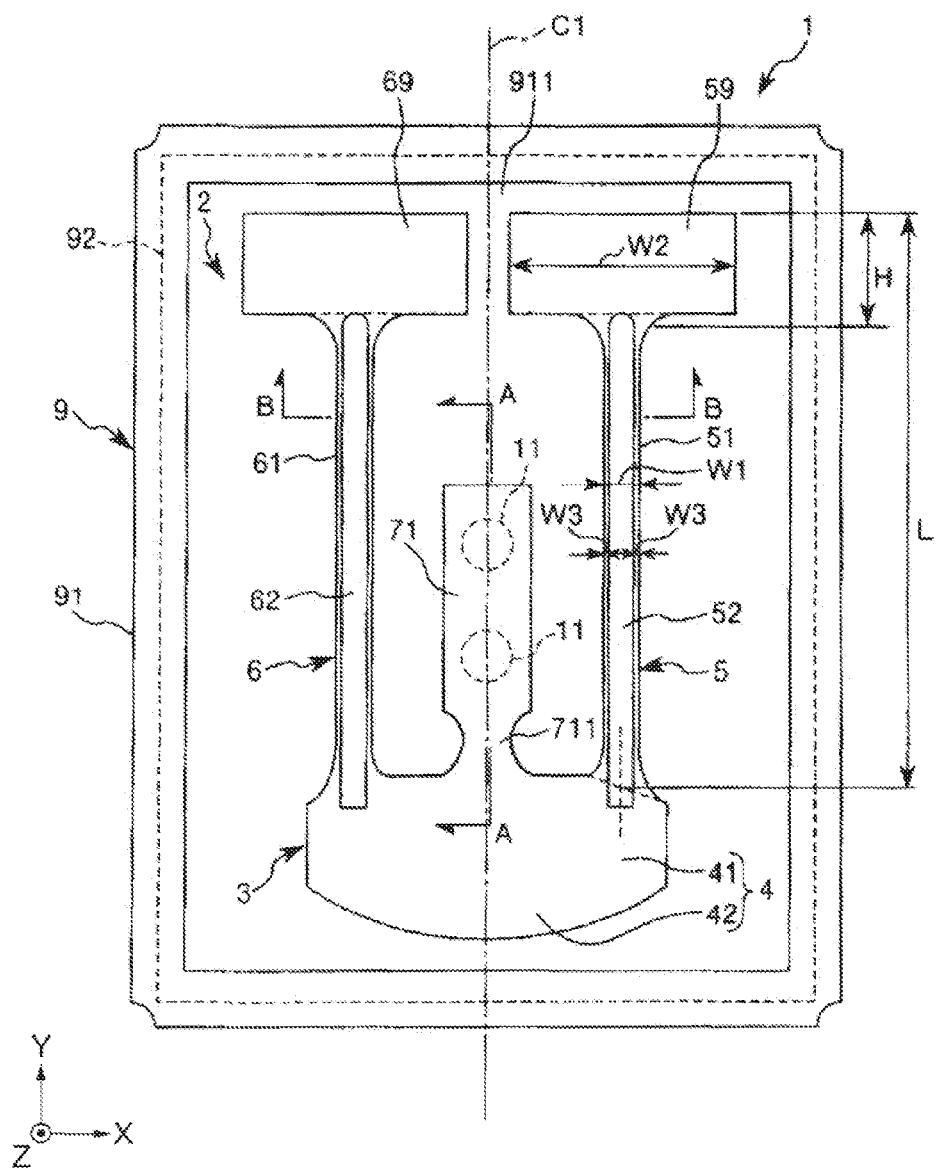
FIG. 1 is a plan view of a resonator according to a first embodiment of the invention.

A resonator element, a resonator, an oscillator, an electronic apparatus, SENSOR, and a moving object according to embodiments of the invention will be described below in detail based on preferable embodiments shown in the drawings.

First Embodiment

Figure 2:
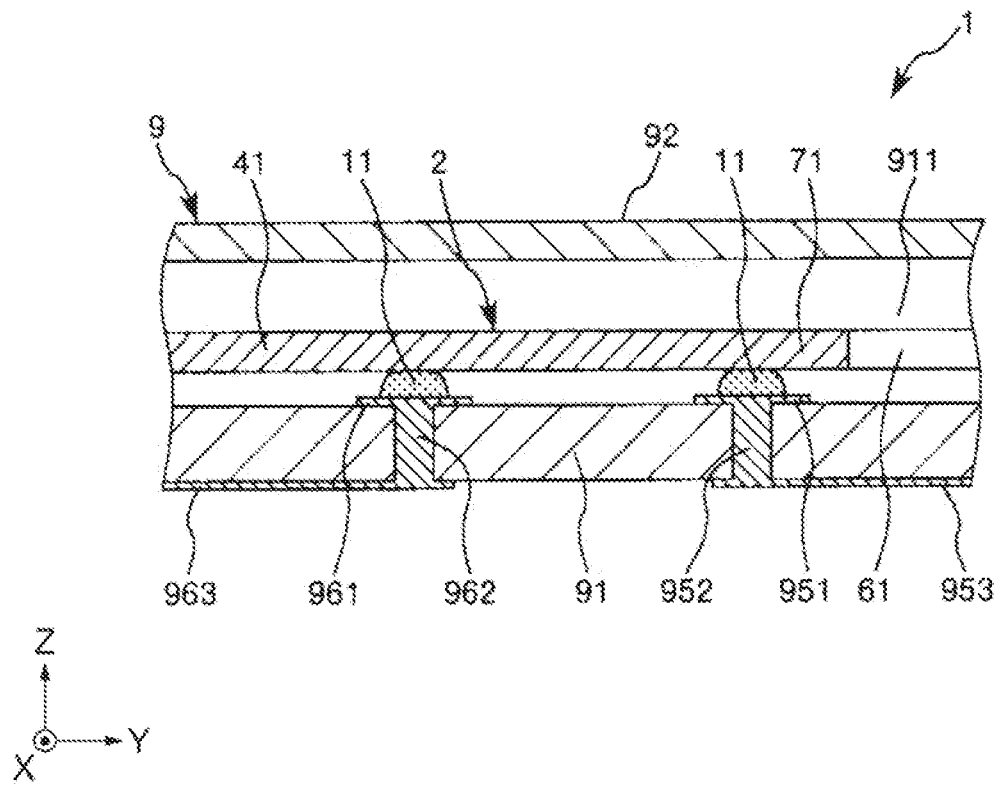
FIG. 2 is a cross-sectional view of the resonator taken along the line A-A in FIG. 1.
Figure 3A:
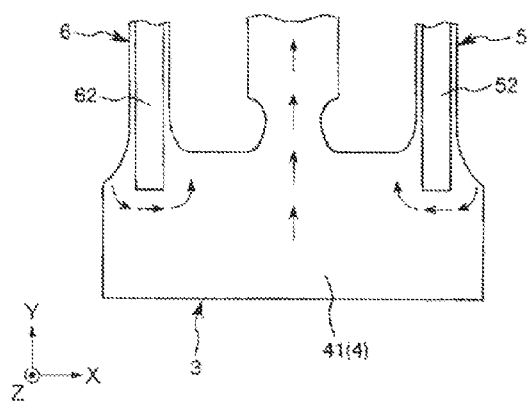
FIGS. 3A and 3B are plan views for describing a principle of vibration leakage reduction.
Figure 3B:
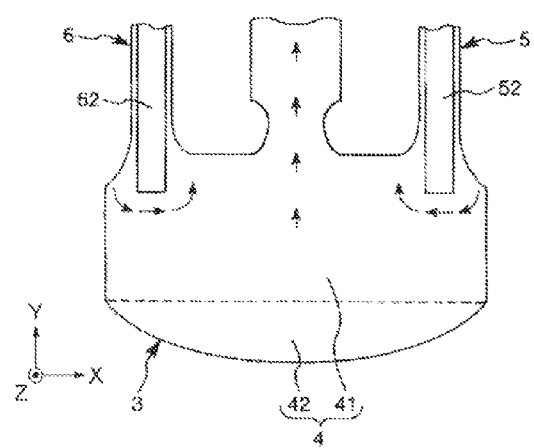
Figure 4:
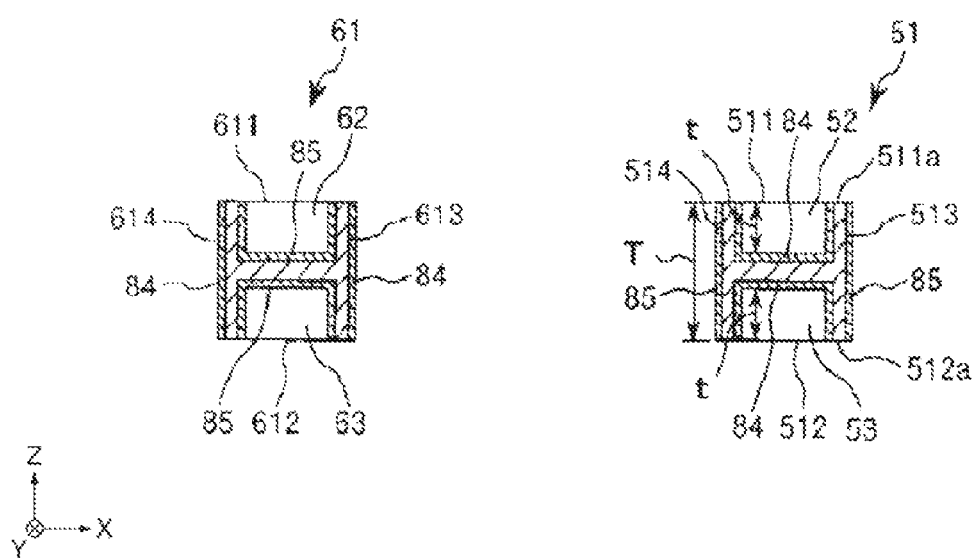
FIG. 4 is a cross-sectional view of the resonator taken along the line B-B in FIG. 1.
Figure 5:
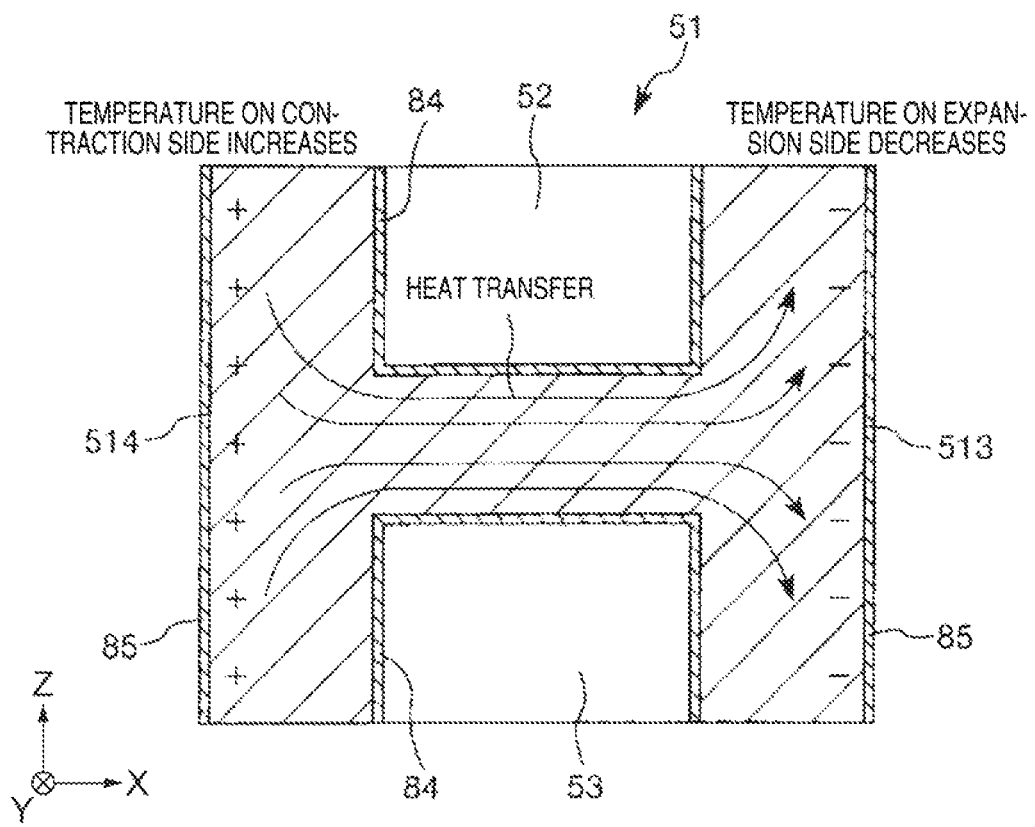
FIG. 5 is a cross-sectional view of a vibration arm for describing heat conduction in bending vibration.
Figure 6:
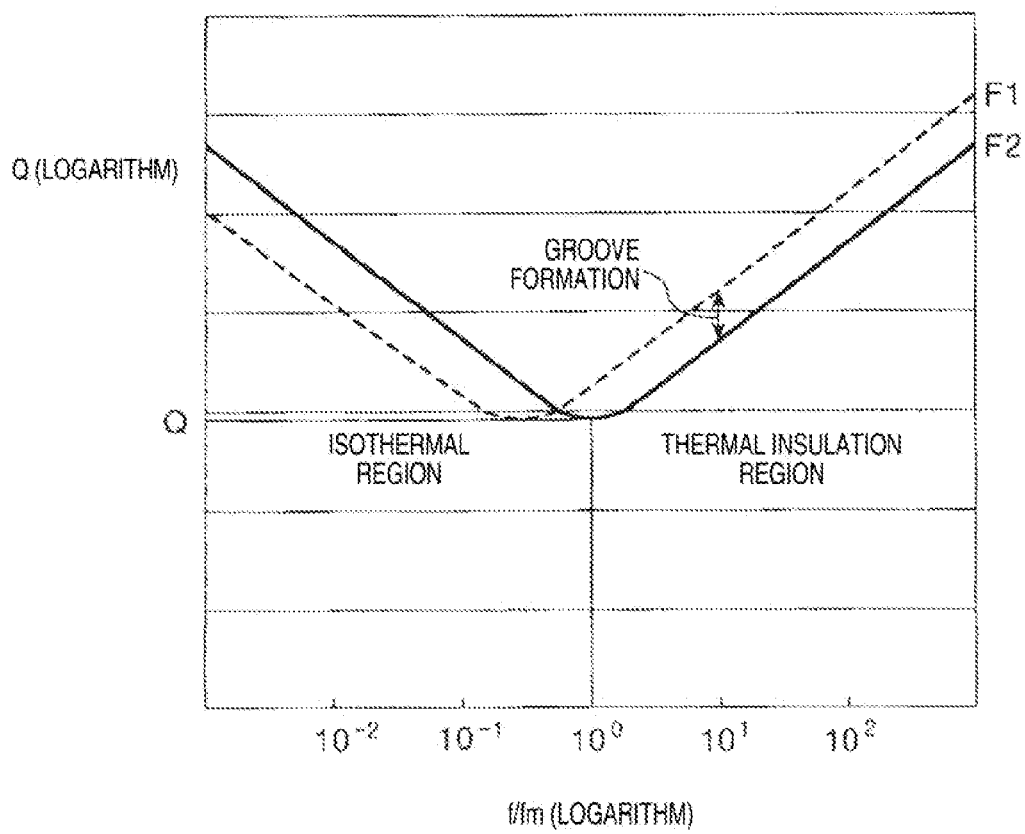
FIG. 6 shows graphs illustrating the relationship between a Q value and f/fm.
Figure 7:
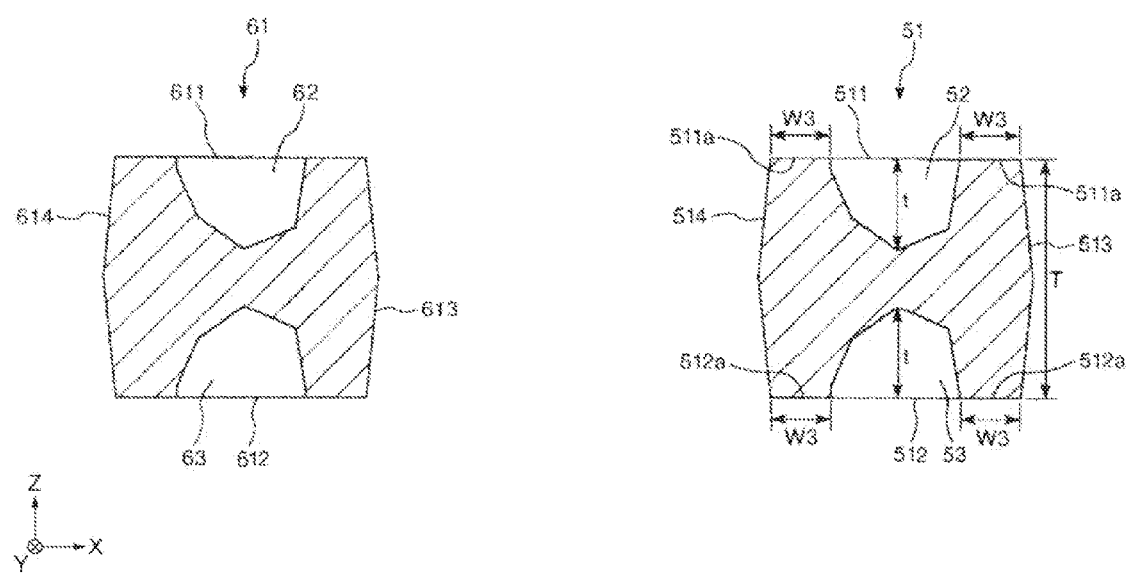
FIG. 7 is a cross-sectional view showing vibration arms formed in a wet etching process.
Figure 8:
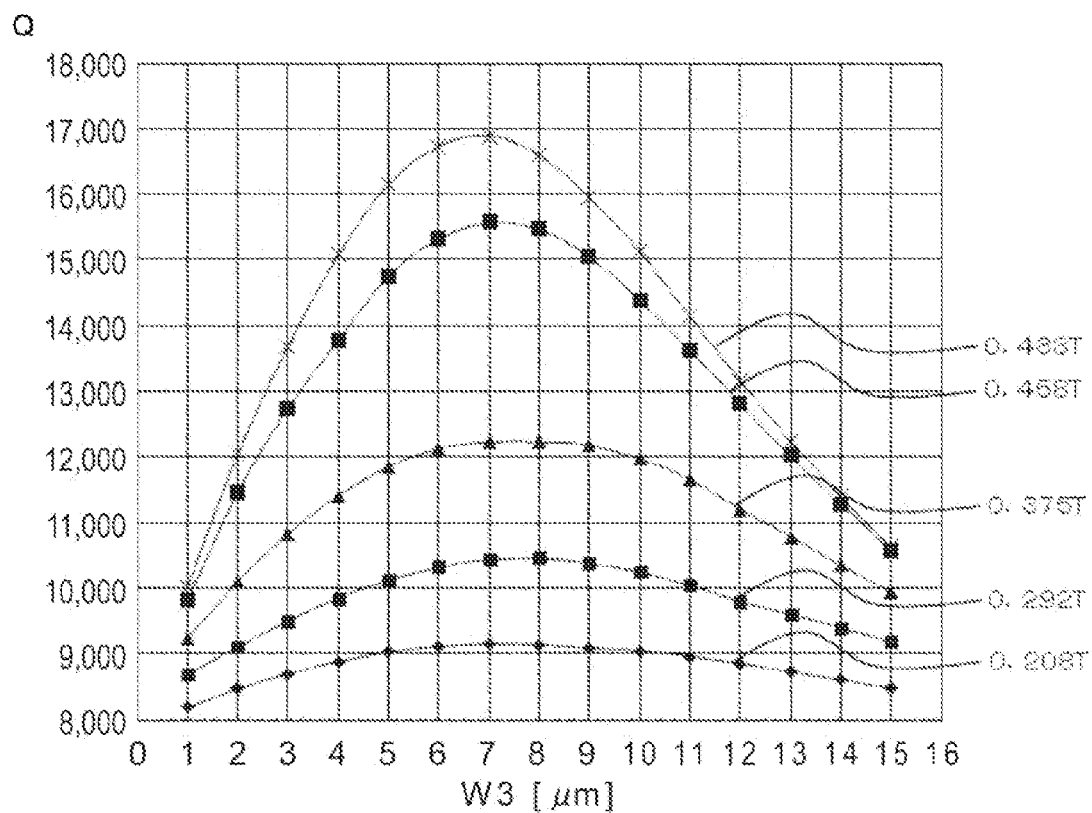
FIG. 8 shows graphs illustrating the relationship between W3 and the Q value.
Figure 9:
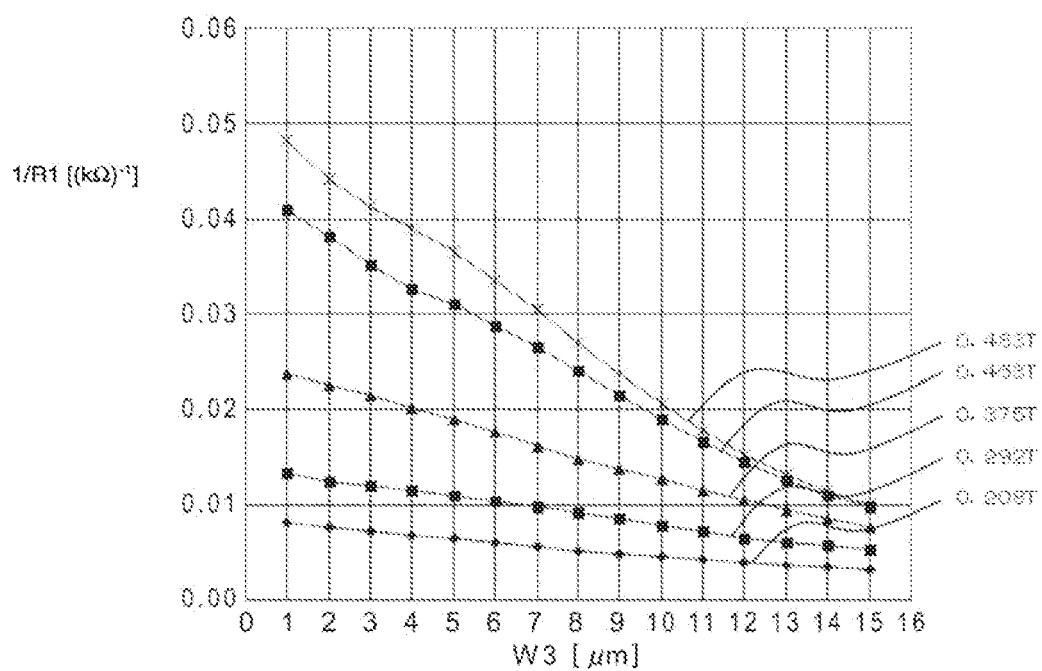
FIG. 9 shows graphs illustrating the relationship between W3 and 1/R1.

FIG. 1 is a plan view of a resonator according to a first embodiment of the invention. FIG. 2 is a cross-sectional view of the resonator taken along the line A-A in FIG. 1. FIGS. 3A and 3B are plan views for describing a principle of vibration leakage reduction. FIG. 4 is a cross-sectional view of the resonator taken along the line B-B in FIG. 1. FIG. 5 is a cross-sectional view of a vibration arm and describes heat conduction in bending vibration. FIG. 6 shows graphs illustrating the relationship between a Q value and f/fm. FIG. 7 is a cross-sectional view showing vibration arms formed in a wet etching process. FIG. 8 shows graphs illustrating the relationship between W3 and the Q value. FIG. 9 shows graphs illustrating the relationship between W3 and 1/R1. In the following description, three axes perpendicular to each other are called an X axis (electrical axis of quartz crystal), a Y axis (mechanical axis of quartz crystal), and a Z axis (optical axis of quartz crystal) for ease of description, as shown in FIG. 1.

1. Resonator

A resonator 1 shown in FIGS. 1 and 2 includes a resonator element 2 (resonator element according to an embodiment of the invention), and a package 9, which accommodates the resonator element 2. The resonator element 2 and the package 9 will be sequentially described below in detail.

Resonator Element

The resonator element 2 includes a quartz crystal substrate 3 and first and second drive electrodes 84, 85 formed on the quartz crystal substrate 3, as shown in FIGS. 1, 2, and 4. In FIGS. 1 and 2, the first and second drive electrodes 84, 85 are omitted for ease of description.

The quartz crystal substrate 3 is formed of a Z-cut quartz crystal plate. The thus formed resonator element 2 can provide an excellent vibrational characteristic. A Z-cut quartz crystal plate is a quartz crystal substrate having the Z axis oriented in the thickness direction. The Z axis preferably coincides with the thickness direction of the quartz crystal substrate 3 but may be slightly inclined to the thickness direction from a viewpoint of reducing a frequency-temperature change in the vicinity of room temperature.

That is, let θ degrees be an inclination angle (−5 degrees≤θ≤15 degrees), and modify the orthogonal coordinate system having the X axis as the electrical axis of quartz crystal, the Y axis as the mechanical axis thereof, and the Z axis as the optical axis thereof described above as follows: The Z axis described above is so inclined by the θ degrees that the +Z side thereof is rotated around the X axis described above in the −Y direction of the Y axis described above to form a Z' axis; and the Y axis is so inclined by the θ degrees that the +Y side thereof is rotated around the X axis described above in the +Z direction of the Z axis described above to form a Y' axis. The quartz crystal substrate 3 has a thickness in the direction along the Z' axis and a principal plane including the X axis and the Y' axis.

The quartz crystal substrate 3 includes a base 4, a pair of vibration arms 5 and 6, which are present on the front end side (first end) of the base 4 and extend from the base 4, and a support arm (support portion) 71, which is located between the vibration arms 5 and 6 and extends from the base 4 in the direction in which the vibration arms 5 and 6 extend, as shown in FIG. 1. The base 4, the vibration arms 5 and 6, and the support arm 71 are therefore formed integrally with one another.

The base 4 has a plate-like shape that extends in an XY plane and has a thickness in the Z'-axis direction. The base 4 has a portion that supports and connects the vibration arms 5 and 6 to each other (body portion 41) and a reduced width portion 42, which reduces the amount of vibration leakage.

The reduced width portion 42 is provided on a base end (second end) side of the body portion 41, that is, the side opposite to the side where the vibration arms 5 and 6 extend. The reduced width portion 42 has a width (length along X-axis direction) that gradually decreases with distance from the vibration arms 5 and 6, that is, a central portion of the base 4 (body portion 41) along a center line C1 between the vibration arms 5 and 6, and the contour (edge) of the reduced width portion 42 has an arch-like (arcuate) shape. Providing the thus formed reduced width portion 42 can effectively suppress leakage of vibration of the resonator element 2.

The leakage of vibration will be specifically described below. It is assumed for simplicity of the description that the shape of the resonator element 2 is symmetric with respect to a predetermined axis (center line C1) parallel to the Y axis.

A case shown in FIG. 3A where no reduced width portion 42 is provided will first be described. When the vibration arms 5 and 6 undergo bending deformation in which they move away from each other, part of the body portion 41, specifically, a portion in the vicinity of the point where the vibration arm 5 is connected to the body portion 41 experiences displacement approximate to a clockwise rotational movement as indicated by arrows, whereas part of the body portion 41, specifically, a portion in the vicinity of the point where the vibration arm 6 is connected to the body portion 41 experiences displacement approximate to a counterclockwise rotational movement as indicated by arrows. (It is, however, noted that the phrase "approximate to rotational movement" is used for convenience because the movement cannot be termed rotational movement in an exact sense.)

Since the X-axis-direction components of the displacements are oriented in opposite directions, they cancel each other in the body portion 41, specifically, a central portion thereof in the X-axis direction, and displacements in the +Y-axis direction are left (It is, however, noted that displacements in the Z-axis direction are also left in an exact sense but they are omitted in the description). That is, the body portion 41 undergoes bending deformation in which the central portion in the X-axis direction is displaced in the +Y-axis direction. The support arm 71, which extends from the body portion 41 that is displaced in the +Y-axis direction, is hence moved or displaced in the +Y-axis direction. Therefore, when an adhesive is placed on the support arm 71 and the support arm 71 is fixed to the package via the adhesive, elastic energy that accompanies the displacement in the +Y-axis direction leaks out of the support arm through the adhesive. The leakage or loss is what is called vibration leakage, which causes degradation of a Q value, resulting in degradation of a CI value.

In contrast, when the reduced width portion 42 having an arch-like (curved) contour is provided as shown in FIG. 3B, the displacements approximate to rotational movement described above prop each other in the reduced width portion 42. That is, in the reduced width portion 42, specifically, a central portion thereof in the X-axis direction, the displacements in the X-axis direction cancel each other, as in the body portion 41, specifically, the central portion thereof in the X-axis direction, and the displacements in the Y-axis direction are also suppressed. Further, since the reduced width portion 42 has an arch-like contour, the displacement in the +Y-axis direction that is otherwise produced in the body portion 41 is also suppressed. As a result, the +Y-axis-oriented displacement of the X-axis-direction central portion of the base 4 provided with the reduced width portion 42 is much smaller than in the case where no reduced width portion 42 is provided. That is, a resonator element having a small amount of vibration leakage can be provided.

The reduced width portion 42 has an arch-like contour in this description, but the reduced width portion 42 does not necessarily has an arch-like contour and may have any shape that provides the effect described above. For example, the following shapes may be employed: a reduced width portion having a width that decreases stepwise along the center line C1 in a plan view and having a step-shaped (stairway-shaped) contour formed of a plurality of straight lines; a reduced width portion having a width that linearly (continuously) decreases along the center line C1 in a plan view and having an angled (triangular) contour formed of two straight lines; and a reduced width portion having a width that linearly (continuously) decreases along the center line C1 in a plan view and having a contour formed of three or more straight lines.

The vibration arms 5 and 6 are located side by side in the X-axis direction (second direction) and extend in parallel to each other along the Y-axis direction (first direction) from the front end of the base 4. Each of the vibration arms 5 and 6 has an elongated shape and has a base end that is a fixed end and a front end that is a free end. Further, the vibration arms 5 and 6 have arm portions 51 and 61 and hammer heads (increased width portions wider than arm portions 51 and 61 in X-axis direction) 59 and 69, which are weight portions provided at the front ends of the arm portions 51 and 52 (on the side facing away from the base 4) and having a substantially rectangular shape in the XY plan view.

The hammer heads 59 and 69, which serve as weight portions, are increased width portions wider than the arm portions 51 and 61 in the X-axis direction but are not necessarily shaped as described above and only need to have a large mass per unit length. For example, the weight portions may be as wide as the arm portions 51 and 61 in the X-axis direction but may be thicker than the arm portions in the Z-axis direction. The weight portions may instead be formed by adding thick portions made of a metal, such as Au, to the arm portions 51 and 61, specifically, the surfaces thereof corresponding to the weight portions. The weight portions may still instead be made of a material having a mass density greater than that of the arm portions 51 and 61.

The arm portion 51 has a pair of principal surfaces 511 and 512 formed of XY planes and a pair of side surfaces 513 and 514 formed of YZ planes and connected to the pair of principal surfaces 511 and 512, as shown in FIG. 4. The arm portion 51 further has a groove 52, which has a bottom and opens through the principal surface 511, and a groove 53, which has a bottom and opens through the principal surface 512. Each of the grooves 52 and 53 extends in the Y-axis direction and has a front end located at the boundary between the arm portion 51 and the hammer head 59 and a base end attached to the base 4. The thus configured arm portion 51 has a substantially H-like transverse cross-sectional shape in a portion where the grooves 52 and 53 are formed.

Forming the grooves 52 and 53 in the vibration arm 5 as described above can reduce the amount of thermoelastic loss and hence provide an excellent vibrational characteristic (which will be described later in detail). The length of the grooves 52 and 53 is not limited to a specific value, and the front end of each of the grooves 52 and 53 may be located at the boundary between the arm portion 51 and the hammer head 59, as in the present embodiment. Instead, when the front end of each of the grooves 52 and 53 extends into the hammer head 59, the degree of stress concentration that occurs at the front end of each of the grooves 52 and 53 and therearound decreases, whereby possibilities of breakage and chipping that occur when an impact is applied decrease. Still instead, when the front end of each of the grooves 52 and 53 is located in a position closer to the base than in the present embodiment, the degree of stress concentration that occurs in the vicinity of the boundary between the arm portion 51 and the hammer head 59 decreases, whereby possibilities of breakage and chipping that occur when an impact is applied decrease.

Further, when the base end of each of the grooves 52 and 53 extends into the base 4, the degree of stress concentration at the boundary between the base and the grooves decreases, whereby possibilities of breakage and chipping that occur when an impact is applied decrease. Instead, when the base end of each of the grooves 52 and 53 is located in a position shifted in the Y-axis direction (direction in which vibration arm 5 extends) from the boundary between the based 4 and the arm portion 51, the degree of stress concentration that occurs in the vicinity of the boundary between the base 4 and the arm portion 51 decreases, whereby possibilities of breakage and chipping that occur when an impact is applied decrease.

When the grooves 52 and 53 are formed, the positions thereof are preferably so adjusted with respect to the position of the vibration arm 5 in the X-axis direction that the center of gravity of the cross section of the vibration arm 5 coincides with the center of the cross-sectional shape of the vibration arm 5. The configuration described above reduces the amount of unnecessary vibration of the vibration arm 5 (specifically, oblique vibration having out-of-plane component), whereby the amount of vibration leakage can be reduced. Further, in this case, since the amount of extra vibration is reduced, a drive region can be relatively increased, whereby the CI value can be lowered.

Moreover, the center of the hammer head 59 in the X-axis direction is preferably slightly shifted from the center of the vibration arm 5 in the X-axis direction. As a result, the amount of vibration of the base 4 in the Z-axis direction, which is undesirably produced when the vibration arm 5 is twisted in the bending vibration, can be reduced, whereby the amount of vibration leakage can be reduced.

The vibration arm 5 has been described above. The vibration arm 6 has the same configuration as that of the vibration arm 5. That is, the arm portion 61 has a pair of principal surfaces 611 and 612 formed in XY planes and a pair of side surfaces 613 and 614 formed in YZ planes and connected to the pair of principal surfaces 611 and 612. The arm portion 61 further has a groove 62, which has a bottom and opens through the principal surface 611, and a groove 63, which has a bottom and opens through the principal surface 612. Each of the grooves 62 and 63 extends in the Y-axis direction and has a front end located at the boundary between the arm portion 61 and the hammer head 69 and a base end attached to the base 4. The thus configured arm portion 61 has a substantially H-like transverse cross-sectional shape in a portion where the grooves 62 and 63 are formed.

Further, the center of the hammer head 69 in the X-axis direction is preferably slightly shifted from the center of the vibration arm 6 in the X-axis direction. As a result, the amount of vibration of the base 4 in the Z-axis direction, which is undesirably produced when the vibration arm 6 is twisted in the bending vibration, can be reduced, whereby the amount of vibration leakage can be reduced.

The vibration arm 5 has a pair of first drive electrodes 84 and a pair of second drive electrodes 85 formed thereon, as shown in FIG. 4. Specifically, one of the first drive electrodes 84 is formed on the inner surface (side surface) of the groove 52, and the other first drive electrode 84 is formed on the inner surface (side surface) of the groove 53. Further, one of the second drive electrodes 85 is formed on a side surface 513, and the other second drive electrode 85 is formed on a side surface 514. Similarly, the vibration arm 6 has a pair of first drive electrodes 84 and a pair of second drive electrodes 85 formed thereon. Specifically, one of the first drive electrodes 84 is formed on a side surface 613, and the other first drive electrode 84 is formed on a side surface 614. Further, one of the second drive electrodes 85 is formed on the inner surface (side surface) of the groove 62, and the other second drive electrode 85 is formed on the inner surface (side surface) of the groove 63.

When an alternate voltage is applied between the first and second drive electrodes 84, 85, the vibration arms 5 and 6 vibrate at a predetermined frequency in an in-plane direction (XY plane direction) in such a way that they repeatedly approach each other and move away from each other.

Each of the first and second drive electrodes 84, 85 is not necessarily made of a specific material and can be made of gold (Au), a gold alloy, platinum (Pt), aluminum (Al), an aluminum alloy, silver (Ag), a silver alloy, chromium (Cr), a chromium alloy, nickel (Ni), a nickel alloy, copper (Cu), molybdenum (Mo), niobium (Nb), tungsten (W), iron (Fe), titanium (Ti), cobalt (Co), zinc (Zn), zirconium (Zr), or any other metal material, indium tin oxide (ITO), or any other conductive material.

Each of the first and second drive electrodes 84, 85 can, for example, be specifically so configured that an Au layer having a thickness of 700 angstroms or smaller is formed on a Cr layer having a thickness of 700 angstroms or smaller. In particular, since Cr and Au cause a large amount of thermoelastic loss, each of the Cr and Au layers preferably has a thickness of 200 angstroms or smaller. On the other hand, to increase dielectric breakdown resistance, each of the Cr and Au layers preferably has a thickness of 1000 angstroms or greater. Further, since Ni has a coefficient of thermal expansion close to that of quartz crystal, replacing the Cr layer with a Ni layer as a base layer reduces thermal stress resulting from the electrodes, whereby a resonator element 2 having satisfactory long-term reliability (aging characteristic) can be provided.

As described above, in the resonator element 2, it is intended to reduce the amount of thermoelastic loss by forming the grooves 52, 53, 62, and 63 in the vibration arms 5 and 6. The reduction in thermoelastic loss will be specifically described below with reference to the vibration arm 5.

The vibration arm 5 undergoes in-plane bending vibration when an alternate voltage is applied between the first drive electrode 84 and the second drive electrode 85, as described above. In the bending vibration, when the side surface 513 of the arm portion 51 contracts, the side surface 514 expands, whereas when the side surface 513 expands, the side surface 514 contracts, as shown in FIG. 5. When the vibration arm 5 does not produce a Gough-Joule effect (when energy elasticity is dominant over entropy elasticity), the contracting one of the side surfaces 513 and 514 experiences an increase in temperature, whereas the expanding one of the side surfaces 513 and 514 experiences a decrease in temperature, so that a difference in temperature occurs between the side surface 513 and the side surface 514, that is, in the arm portion 51. Heat conduction resulting from the difference in temperature causes vibrational energy loss, which lowers the Q value of the resonator element 2. The energy loss leading to a decrease in the Q value is called thermoelastic loss.

In a resonator element that has the configuration of the resonator element 2 and vibrates in a bending vibration mode, when a bending vibration frequency (mechanical bending vibration frequency) f of the vibration arm 5 changes and coincides with a thermal relaxation frequency fm, the Q value is minimized. The thermal relaxation frequency fm can be determined from an expression $fm=1/(2\pi\tau)$ (In the expression, $\pi$ represents the circle ratio, and $\tau$ represents a relaxation time required for the temperature difference to be multiplied by $(e-1)$ due to the heat conduction, where e is Napier's number).

Let fm0 be the thermal relaxation frequency in a case where the vibration arm 5 is assumed to have a flat-plate structure (structure having rectangular cross-sectional shape), and fm0 can be determined from the following expression.

$$fm0=\pi k/(2\rho Cpa^2) \quad (1)$$

In the expression, $\pi$ represents the circle ratio, k represents the heat conductivity of the vibration arm 5 in the vibration direction, $\rho$ represents the mass density of the vibration arm 5, Cp represents the heat capacity of the vibration arm 5, and a represents the width of the vibration arm 5 in the vibration direction (effective width). When constants of the material itself of the vibration arm 5 (that is, quartz crystal) are substituted into the heat conductivity k, the mass density $\rho$, and the heat capacity Cp in Expression (1), the resultant thermal relaxation frequency fm0 is a value in a case where no groove 52 or 53 is provided in the vibration arm 5.

The grooves 52 and 53 are so formed in the vibration arm 5 that the grooves are located between the side surface 513 and the side surface 514. As a result, a heat transfer path that allows elimination of the difference in temperature between the side surfaces 513 and 514 produced when the vibration arm 5 undergoes the bending vibration is so formed that the path detours around the grooves 52 and 53. The thus formed heat transfer path is longer than the direct distance (minimum distance) between the side surfaces 513 and 514. As a result, relaxation time $\tau$ increases as compared with the case where no groove 52 or 53 is provided in the vibration arm 5, whereby the thermal relaxation frequency fm decreases.

FIG. 6 shows graphs illustrating how the Q value of the resonator element operating in the bending vibration mode depends on f/fm. In FIG. 6, a curve F1 indicted by the dotted line shows a case where grooves are formed in a vibration arm (a case where the vibration arm has an H-like transverse cross-sectional shape) as in the case of the resonator element 2, and a curve F2 indicated by the solid line shows a case where no groove is formed in a vibration arm (a case where the vibration arm has a rectangular transverse cross-sectional shape). The curves F1 and F2 have the same shape, but the decrease in thermal relaxation frequency fm described above causes the curve F1 to shift from the curve F2 in a direction in which the frequency ratio decreases, as shown in FIG. 6. Therefore, when the following expression (2) is satisfied, where fm1 represents the thermal relaxation frequency in a case where grooves are formed in a vibration arm as in the case of the resonator element 2, the Q value of the resonator element having grooves formed in the vibration arm is always higher than the Q value of the resonator element having no groove formed in the vibration arm.

$$f \ne \sqrt{fm0 \cdot fm1} \quad (2)$$

Further, when the relationship f/fm0>1 is always satisfied, a further higher Q value can be provided.

In FIG. 6, the region where f/fm1<1 is satisfied is also called an isothermal region, where the Q value increases as f/fm decreases. The reason for this is that the difference in temperature in the vibration arm described above does not tend to occur as the mechanical frequency of the vibration arm decreases (as the speed at which the vibration arm vibrates decreases). Therefore, at an extreme point where f/fm approaches 0 (zero) as closest as possible, the vibration arm operates in an isothermal quasi-static mode, in which the thermoelastic loss approaches 0 (zero) as closest as possible. On the other hand, a region where f/fm>1 is satisfied is also called a thermal insulation region, where the Q value increases as f/fm increases. The reason for this is that switching between an increase in temperature of one of the side surfaces and the resultant temperature effect and an increase in temperature of the other side surface and the resultant temperature effect accelerate as the mechanical frequency of the vibration arm increases, so that there is not enough time for the heat conduction described above. Therefore, at an extreme point where f/fm has a largest possible value, the vibration arm operates in a thermal insulation mode, in which the thermoelastic loss approaches 0 (zero) as closest as possible. The fact that the relationship f/fm>1 is satisfied therefore means that f/fm has a value in the thermal insulation region.

Since each of the materials of which the first and second drive electrodes 84, 85 are made (metal material) has thermal conductivity higher than that of quartz crystal, of which the vibration arms 5 and 6 are made, the vibration arm 5 actively experiences thermal conduction via the first drive electrodes 84, and the vibration arm 6 actively experiences thermal conduction via the second drive electrodes 85. When the vibration arms 5 and 6 actively experience thermal conduction via the first and second drive electrodes 84, 85 respectively, the relaxation timer undesirably decreases. It is therefore preferable to prevent or suppress the heat conduction described above from occurring by dividing the first drive electrodes 84 in the vibration arm 5 at the bottoms of the grooves 52 and 53 into portions on the side surfaces 513 and 514 and dividing the second drive electrodes 85 in the vibration arm 6 at the bottoms of the grooves 62 and 63 into portions on the side surfaces 613 and 614. As a result, the relaxation time τ will not shorten, whereby a resonator element 2 having an increased Q value can be provided.

A description will next be made of the relationship between the overall length of the vibration arms 5, 6 and the length and width of the hammer heads 59, 69. Since the vibration arms 5 and 6 have the same configuration, the vibration arm 5 will be described below as a representative example, and the vibration arm 6 will not be described.

Now, let L [μm] be the overall length of the vibration arm 5 (length in Y-axis direction) and H [μm] be the length of the hammer head 59 (length in Y-axis direction), as shown in FIG. 1. The vibration arm 5 preferably satisfies a relationship $0.012<H/L<0.3$, more preferably a relationship $0.046<H/L<0.223$. When either of the relationships described above is satisfied, the CI value of the resonator element 2 can be suppressed low enough to reduce the amount of vibration loss and hence provide an excellent vibrational characteristic.

In the present embodiment, the base end of the vibration arm 5 is set on a line segment that connects the location where the side surface 514 is connected to the base 4 to the location where the side surface 513 is connected to the base 4 in a position that coincides with the center of the width (length in X-axis direction) of the vibration arm 5. A free end portion of the arm portion 51 is so tapered that the width thereof gradually increases in the direction toward the free end, and it is assumed that when the tapered portion includes a portion having a width (length in X-axis direction) at least 1.5 times wider than the width (length in X-axis direction) of the arm portion 51, the portion is also part of the length H of the hammer head 59.

The vibration arm 5 further preferably satisfies a relationship $1.5 \leq W2/W1 \leq 10.0$, more preferably a relationship $1.6 \leq W2/W1 \leq 7.0$, where W1 [μm] represents the width (length in X-axis direction) of the arm portion 51, and W2 [μm] represents the width (length in X-axis direction) of the hammer head 59. When either of the relationships described above is satisfied, it is ensured that the hammer head 59 has a wide width. As a result, even when the length H of the hammer head 59 is relatively short (even when the length H is shorter than 30% of L) as described above, the effect provided by the mass of the hammer head 59 can be sufficiently provided. Therefore, when the relationship $1.5 \leq W2/W1 \leq 10.0$ is satisfied, the overall length L of the vibration arm 5 can be small enough to reduce the size of the resonator element 2.

As described above, when the vibration arm 5 satisfies the relationship $0.012<H/L<0.3$ and the relationship $1.5 \leq W2/W1 \leq 10.0$, the two relationships work synergistically with each other to provide a resonator element 2 that is compact and has a sufficiently small CI value.

When L is 2 mm or smaller, preferably 1 mm or smaller, a compact resonator element 2 used in an oscillator incorporated in a mobile music player, an IC card, and any other similar apparatus can be provided. Further, when W1 is 100 μm or smaller, preferably 50 μm or smaller, a resonator element 2 that resonates at a low frequency and is used in a low-power-consumption oscillation circuit can be provided even in the range of L described above.

To form a resonator element that is formed of a Z-cut quartz crystal plate, has a vibration arm extending in the Y-axis direction, and undergoes bending vibration in the X-axis direction in the thermal insulation region, W1 is preferably 12.8 μm or greater. To form a resonator element that is formed of a Z-cut quartz crystal plate, has a vibration arm extending in the X-axis direction, and undergoes bending vibration in the Y-axis direction in the thermal insulation region, W1 is preferably 14.4 μm or greater. To form a resonator element that is formed of an X-cut quartz crystal plate, has a vibration arm extending in the Y-axis direction, and undergoes bending vibration in the Z-axis direction in the thermal insulation region, W1 is preferably 15.9 μm or greater. Since any of the configurations described above allows the resonator element to reliably operate in the thermal, insulation region, the thermoelastic loss is lowered and the Q value is improved accordingly by forming the grooves 52 and 53, and the CI value is lowered by driving the resonator element by using a region where the grooves 52 and 53 are formed (where electric field efficiency is high and large drive area is provided).

Further, let W3 [μm] be the width (length in X-axis direction) of part of the principal surface 511, specifically, a bank-shaped portion 511a located on each side of the groove 52 in the X-axis direction (principal surfaces disposed on both sides of the groove 52 along the width direction perpendicular to the longitudinal direction of the vibration arm) and part of the principal surface 512, specifically, a bank-shaped portion 512a located on each side of the groove 53 in the X-axis direction, and W3 is set at 6 μm or smaller. With this configuration, the Q value of the resonator element 2 can be maintained at a relatively high value and sufficiently lower equivalent series resistance R1 (CI value) at the same time. As a result, a resonator element 2 that provides an excellent vibrational characteristic but consumes a small amount of power can be provided.

The bank-shaped portions 511a and 512a in other words correspond to portions having the width W3 along the X-axis direction and located between the side surface 513, which is one outer edge of the arm portion 51, which forms the vibration arm 5, and the edges of the grooves 52 and 53 that are located on one side or on the side where the side surface 513 is present and portions having the width W3 along the X-axis direction and located between the side surface 514, which is the other outer edge of the arm portion 51 and the edges of the grooves 52 and 53 that are located on the other side or on the side where the side surface 514 is present.

A ground on which the width W3 of each of the bank-shaped portions 511a and 512a is set at 6 μm or smaller will now be described based on a result of a simulation conducted by the present inventors. In the following description, a resonator element 2 formed by patterning a Z-cut quartz crystal plate and having a bending vibration frequency (mechanical bending vibration frequency) f of 32.768 kHz is used as a representative example, but the present inventors have shown that the simulation result shown below hardly changes over a range of the bending vibration frequency f of 32.768 kHz±1 kHz.

The resonator element 2 used in the present simulation is formed by patterning a Z-cut quartz crystal plate (angle of rotation is 0°) in a wet etching process. Each of the grooves 52 and 53 therefore has a shape that exposes a crystalline plane of the quartz crystal, as shown in FIG. 7. The cross section shown in FIG. 7 corresponds to the cross section taken along the line B-B in FIG. 1. Since the etching rate in the −X-axis direction is lower than the etching rate in the +X-axis direction, the side surface on the −X-axis-direction side has relatively gentle inclination, whereas the side surface on the +X-axis-direction side has steep inclination close to verticality.

The vibration arm 5 of the resonator element 2 used in the present simulation is so sized that the overall length L is 930 μm, the thickness T is 120 μm, the width W1 of the arm portion 51 is 80 μm, the width W2 of the hammer head 59 is 138 μm, and the length H of the hammer head 59 is 334 μm. In the thus configured resonator element 2, the simulation was made by changing the width W3 of the bank-shaped portions 511a and 512a.

The present inventors have confirmed that the simulation result described below tends to be unchanged even when the overall length L, the thickness T, the width W1, the width W2, and the length H are changed. It is noted that the resonator element 2 used in the present simulation does not have the first and second drive electrodes 84, 85 formed therein.

FIG. 8 shows graphs illustrating the relationship between the width W3 of the bank-shaped portions 511a, 512a and the Q value (Q value after F conversion) in cases where the maximum depth t of the grooves 52 and 53 is set at 0.208T, 0.292T, 0.375T, 0.458T, and 0.483T. FIG. 9 shows graphs illustrating the relationship between the width W3 of the bank-shaped portions 511a, 512a and the reciprocal of R1 (1/R1) in the cases where the maximum depth t of the grooves 52 and 53 is set at 0.208T, 0.292T, 0.375T, 0.458T, and 0.483T.

The graphs shown in FIGS. 8 and 9 are created as follows: First, the Q value is determined in consideration only of the thermoelastic loss by using a finite element method. Since the Q value has a frequency dependency, the determined Q value is converted into a Q value at 32.768 kHz (Q value after F conversion). The graphs shown in FIG. 8 are created by plotting the Q value after F conversion along the vertical axis and W3 along the horizontal axis. Further, R1 is calculated based on the Q value after F conversion. Since R1 also has a frequency dependency, the determined R1 is converted into R1 at 32.768 kHz, and the graph shown in FIG. 9 is created by plotting the reciprocal of the converted R1 along the vertical axis and W3 along the horizontal axis. A larger Q value allows the resonator element 2 to show a better vibrational characteristic, and a smaller R1 (larger 1/R1) allows the resonator element 2 to consume lower power.

A Q value can be converted into a Q value after F conversion as follows by using Expression (1) described above and Expression (3) described below.

$$Q = \{\rho C p/(C\alpha 2H)\} \times [\{1+(f/fm0)2\}/(f/fm0)] \tag{3}$$

In Expression (3), ρ represents the mass density of the vibration arm 5, Cp represents the heat capacity of the vibration arm 5, C represents the elastic stiffness constant of the vibration arm 5 that expands or contracts along its length, α represents the coefficient of thermal expansion of the vibration arm 5 in the lengthwise direction thereof, H represents the absolute temperature, and f represents the natural frequency. It is noted that the constant a represents the width of the vibration arm 5 that is assumed to have a flat-plate structure (flat-plate shape) (effective width), and a Q value can be converted into a Q value after F conversion also by using the value of the constant a.

First, assuming that F1 is the natural frequency of the vibration arm 5 used in the simulation and Q1 is a determined Q value, a value of a that leads to f=F1 and Q=Q1 is determined by using Expressions (1) and (3). The determined a is then used along with an assumption of f=32.768 kHz to calculate a Q value from Expression (3). The thus obtained Q value is a Q value after F conversion.

The Q value is maximized when the width W3 of the bank-shaped portions 511a and 512a is 7 μm irrespective of the depth of the grooves 52 and 53, as shown in FIG. 8. On the other hand, R1 tends to decrease as the width W3 of the bank-shaped portions 511a and 512a decreases, as shown in FIG. 9. The resonator element is typically so designed that the Q value is maximized, that is, the width W3 of the bank-shaped portions 511a and 512a is about 7 μm. The thus designed resonator element 2, however, cannot sufficiently lower its power consumption.

To address the problem, in the invention, a design value of the width W3 of the bank-shaped portions 511a and 512a is intentionally not set at the typically employed value (7 μm, which maximizes Q value), but a value of the width W3 (6 μm or smaller) that allows R1 to be further lowered at the expense of the Q value to some extent is preferentially employed. The thus designed resonator element 2 allows the Q value thereof to be maintained relatively high and the equivalent series resistance R1 (CI value) to be sufficiently low at the same time. As a result, a resonator element 2 that provides an excellent vibrational characteristic but consumes a small amount of power can be provided.

The width W3 of the bank-shaped portions 511a and 512a only needs to be 6 μm or smaller but is preferably set at a value from 0.1 μm or greater to 6 μm or smaller, more preferably from 0.5 μm or greater to 4 μm or smaller, still more preferably from 1 μm or greater to 3 μm or smaller. Setting the width W3 at a value within any of the ranges described above can further lower R1 (CI value) of the resonator element 2 and hence allows the resonator element 2 to be driven with further reduced power consumption. Forming bank-shaped portions 511a and 512a having a width W3 smaller than the lower limit described above is difficult or results in an increase in cost because an extremely high-precision processing technology is required.

It is further preferable that the thickness T of the vibration arm 5 (arm portion 51) and the maximum depth t of the grooves 52 and 53 satisfy a relationship $0.458T \le t \le 0.483T$, and that the width W3 of the bank-shaped portions 511a and 512a and η, which is expressed by 2t/T, satisfy a relationship $-36.000\eta + 39.020 \le W3$ [µm] $\le 26.000\eta - 15.320$ (provided that $0.916 \le \eta \le 0.966$). When the relationships described above are satisfied, a resonator element 2 having a more excellent vibrational characteristic can be provided.

In particular, the depth of the grooves 52 and 53, that is, η is preferably maximized, specifically, 0.6 or greater, more preferably 0.75 or greater, still more preferably 0.9 or greater. The thus set depth of the grooves 52 and 53 or η can increase the areas of the formed first and second drive electrodes 84, 85, whereby R1 (CI value) of the resonator element 2 can be further lowered and hence a resonator element 2 driven at further reduced power consumption can be provided.

Further, when η, which satisfies the relationship 2t/T, is fixed, the greater the thickness T of the vibration arm 5 (quartz crystal substrate 3), the greater t is. Greater t can provide larger areas of the formed first and second drive electrodes 84, 85, whereby R1 of the resonator element 2 can be further lowered. Specifically, the thickness T of the vibration arm 5 (quartz crystal substrate 3) is preferably 50 µm or greater, more preferably 110 µm or greater, still more preferably 160 µm or greater. The upper limit of the thickness T of the vibration arm 5 is not limited to a specific value but is preferably 300 µm or smaller. When the thickness T of the vibration arm 5 is greater than the upper limit, the resonator element 2 tends to show a high degree of shape asymmetry, although depending on conditions under which the quartz crystal substrate 3 is processed (wet etching condition).

The support arm 71, which extends from the base 4 (body portion 41) along the center line C1 (Y-axis direction), is provided between the pair of vibration arms 5 and 6 (arm portions 51 and 61) described above. The support arm 71 has a substantially rectangular shape in an XY plan view, and the resonator element 2, specifically, the support arm 71 is fixed to the package 9 via a conductive adhesive 11, as shown in FIGS. 1 and 2. How to fix the support arm 71 to the package 9 is not limited a specific method, and the support arm 71 may instead be fixed to the package 9 via Au or any other metal. The configuration described above can effectively reduce the amount of vibration leakage.

Further, the support arm 71 has a constricted portion 711, where the length (width) of the support arm 71 along the X-axis direction decreases, in the vicinity of the boundary between the support arm 71 and the base 4. The constricted portion 711 allows the resonant frequency in an X in-phase mode in which the vibration arms 5 and 6 undergo bending vibration in the same direction in an XY plane to be shifted from the resonant frequency in a main mode in which the vibration arms 5 and 6 undergo bending vibration in such a way that they move away from each other and approach each other. As a result, when the resonator element 2 undergoes the bending vibration in the main mode, what is called coupled vibration, in which the vibrational attitude of the resonator element operating in the X in-phase mode overlaps with the vibrational attitude of the resonator element operating in the main mode, is unlikely to occur, whereby the amount of vibration leakage can be reduced.

The thus configured resonator element 2 can be produced by processing a quartz crystal substrate, for example, by using an alkali wet etching or any other wet etching, laser beam etching, or reactive gas etching or any other dry etching. It is particularly preferable that a quartz crystal substrate is processed in a wet etching process, which can precisely process a quartz crystal substrate by using a simple apparatus.

Package

The package 9 has a box-shaped base 91, which has a recess 911 that opens upward, and a plate-shaped lid 92, which is so bonded to the base 91 that the lid 92 closes the opening of the recess 911. The thus configured package 9 has an accommodation space formed when the lid 92 closes the recess 911, and the accommodation space hermetically accommodates the resonator element 2. The resonator element 2, specifically, the support arm 71 is fixed to the bottom surface of the recess 911 via the conductive adhesive 11, which is, for example, a mixture of an epoxy-based or acryl-based resin and conductive fillers.

The accommodation space may have a reduced pressure (is preferably maintained under vacuum) or may be filled with nitrogen, helium, argon, or any other inert gas. The vibrational characteristic of the resonator element 2 can thus be improved.

The base 91 is not necessarily made of a specific material and can be made of an aluminum oxide or any of a variety of other ceramics. The lid 92 is not necessarily made of a specific material and is preferably formed of a member having a coefficient of linear expansion close to that of the material of which the base 91 is made. For example, when the material of which the base 91 is made is any of the ceramics described above, the lid 92 is preferably made of Kovar or any other alloy. How to bond the base 91 and the lid 92 to each other is not limited to a specific method, and they can be bonded to each other via an adhesive, by using seam welding, or in any other process.

Connection terminals 951 and 961 are formed on the bottom surface of the recess 911 of the base 91. Although not shown, the first drive electrodes 84 in the resonator element 2 are drawn to a point on the support arm 71 somewhere along the Y-axis direction and electrically connected there to the connection terminal 951 via the conductive adhesive 11. Similarly, although not shown, the second drive electrodes 85 in the resonator element 2 are drawn to a point on the support arm 71 somewhere along the Y-axis direction and electrically connected there to the connection terminal 961 via the conductive adhesive 11.

The connection terminal 951 is electrically connected to an outer terminal 953, which is formed on the bottom surface of the base 91, via a through electrode 952, which passes through the base 91, and the connection terminal 961 is electrically connected to an outer terminal 963, which is formed on the bottom surface of the base 91, via a through electrode 962, which passes through the base 91.

Each of the connection terminals 951 and 961, the through electrodes 952 and 962, and the outer terminals 953 and 963 is not limited to a specific material as long as it is conductive, and can, for example, be formed of a metal coating produced by layering a Ni (nickel) coating, an Au (gold) coating, an Ag (silver) coating, a Cu (copper) coating, or any other coating on a metalized layer (primary layer) made, for example, of Cr (chromium) or W (tungsten).

Second Embodiment

A resonator according to a second embodiment of the invention will next be described.

Figure 10:
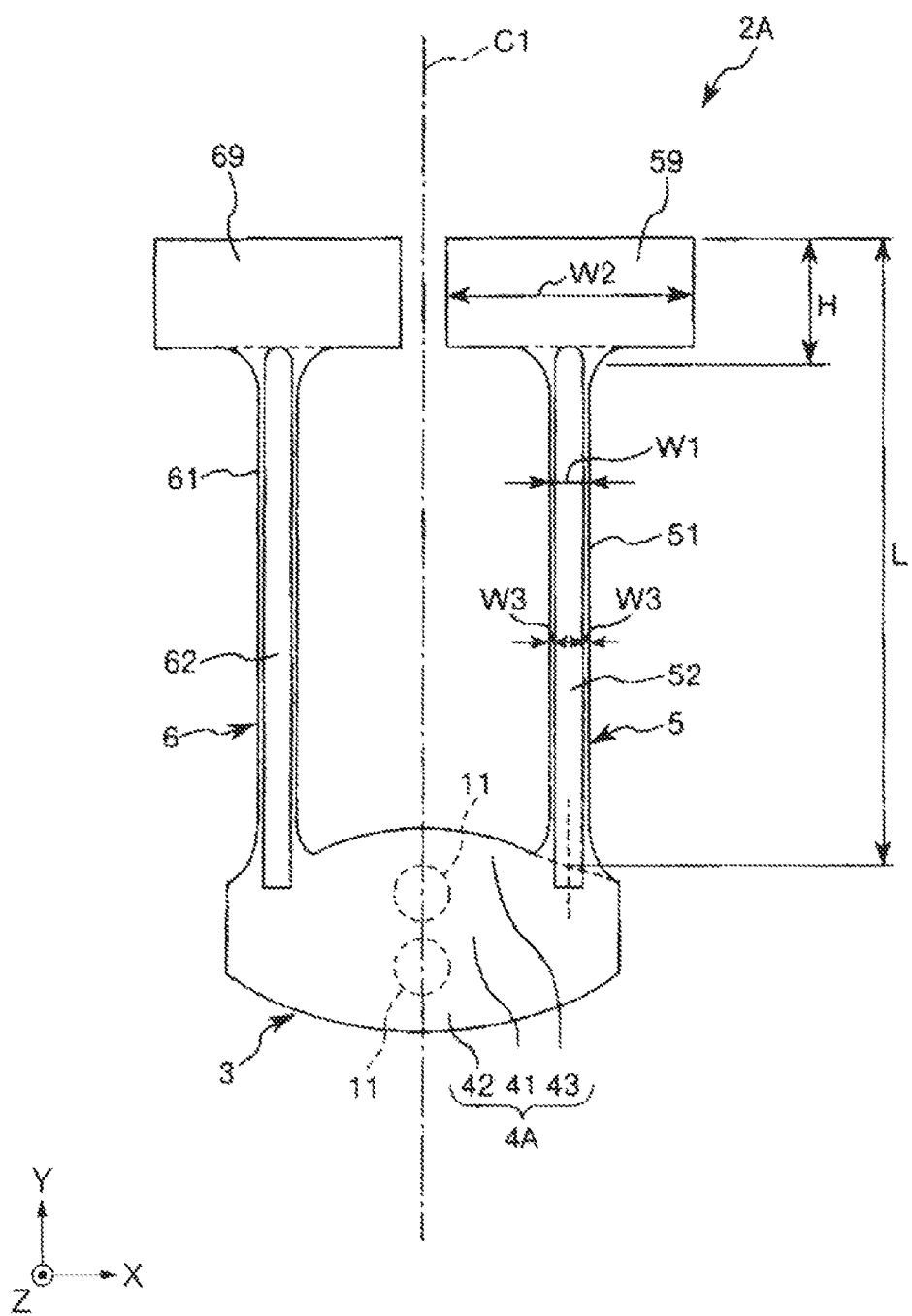
FIG. 10 is a plan view of a resonator element provided in a resonator according to a second embodiment of the invention.

FIG. 10 is a plan view of a resonator element provided in the resonator according to the second embodiment of the invention.

In the following description, the resonator according to the second embodiment will be described primarily about items different from those in the first embodiment described above and the same items as those in the first embodiment will not be described.

The resonator according to the second embodiment is the same as the resonator according to the first embodiment described above except the configuration of the resonator element. The same components as those in the first embodiment described above have the same reference characters.

A base 4A of a resonator element 2A includes the body portion 41, the reduced width portion 42 provided on the base end (second end) side of the body portion 41, and a reduced width portion 43 provided between the vibration arms 5 and 6 and on the front end (first end) side of the body portion 41, as shown in FIG. 10. The thus configured resonator element 2A, specifically the body portion 41 is fixed to the package 9 via the conductive adhesive portions 11, 11. The support arm 71 is therefore omitted.

The reduced width portion 43 has a width (length along X-axis direction) that gradually decreases with distance from a central portion of the base 4A (body portion 41) along the center line C1 between the vibration arms 5 and 6, and the contour (edge) of the reduced width portion 43 has an arch-like (arcuate) shape. The thus shaped reduced width portion 43 has the same function as that of the reduced width portion 42. Further, in the present embodiment, the conductive adhesive portions 11, 11 are disposed along the center line C1 but may instead be disposed along the direction perpendicular to the center line C1 (X-axis direction).

The second embodiment described above can also provide the same advantageous effects as those provided by the first embodiment described above. In particular, according to the second embodiment, since the support arm 71 can be omitted, the length (width) of the resonator element 2A along the X-axis direction can be reduced. The base 4A may not have the reduced width portion 42 but may only have the reduced width portion 43 or may not have the reduced width portion 43 but may only have the reduced width portion 42.

Third Embodiment

A resonator according to a third embodiment of the invention will next be described.

Figure 11:
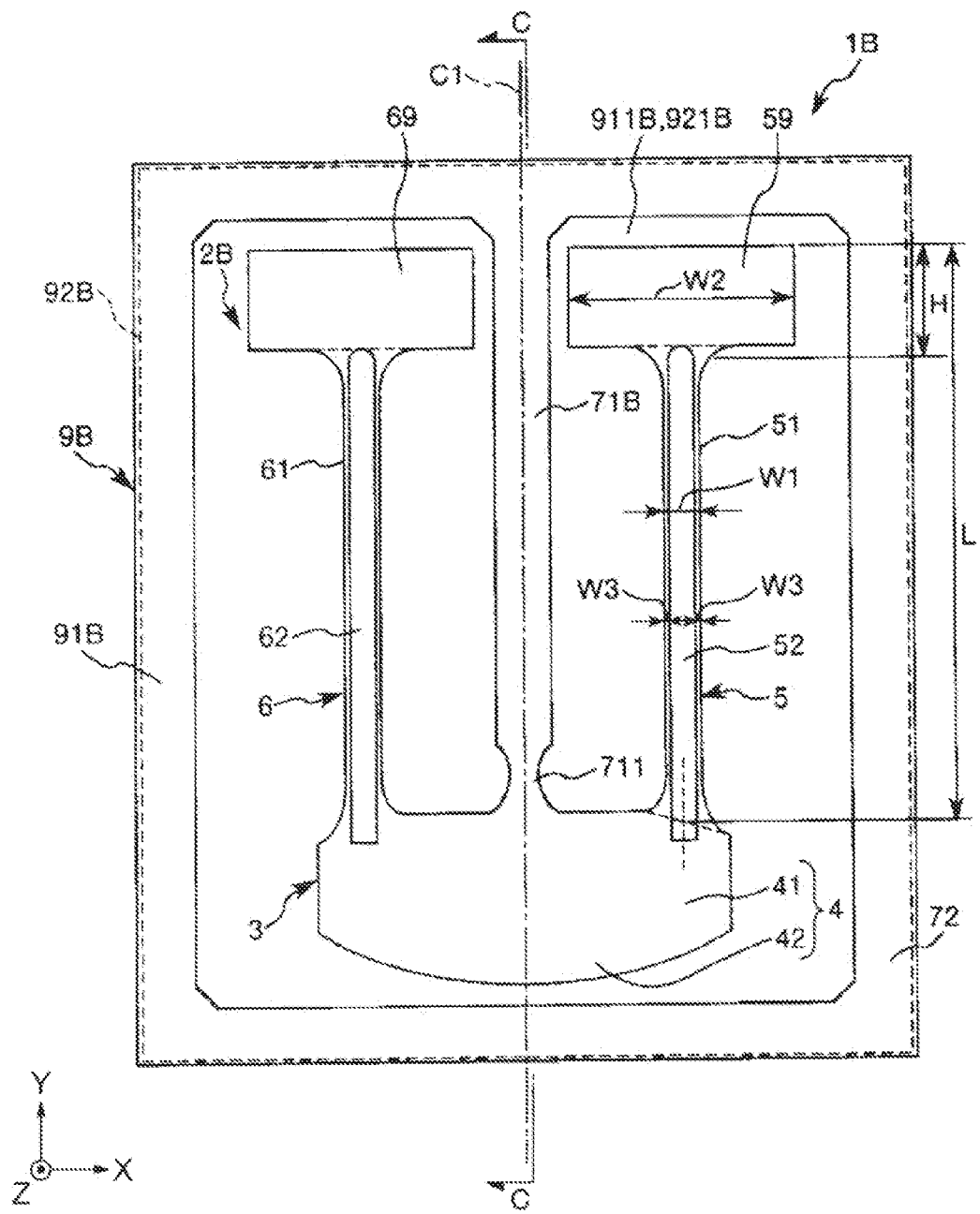
FIG. 11 is a plan view of a resonator according to a third embodiment of the invention.
Figure 12:
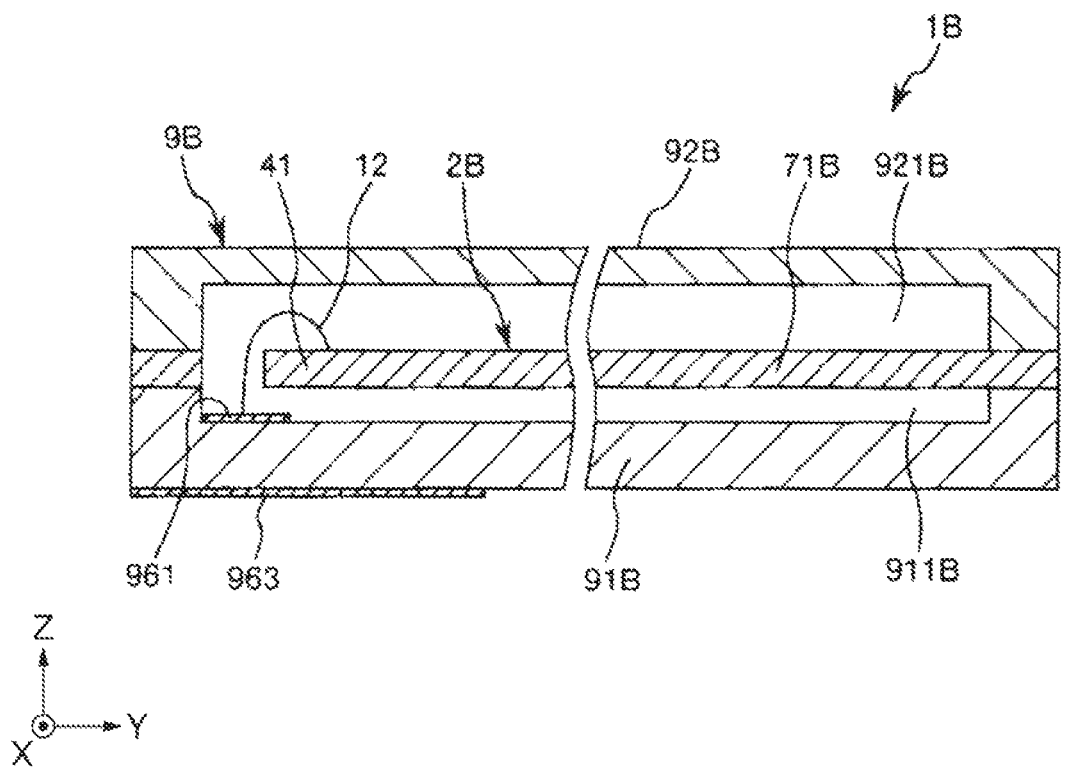
FIG. 12 is a cross-sectional view of the resonator taken along the line C-C in FIG. 11.

FIG. 11 is a plan view of the resonator according to the third embodiment of the invention, and FIG. 12 is a cross-sectional view of the resonator taken along the line C-C in FIG. 11.

In the following description, the resonator according to the third embodiment will be described primarily about items different from those in the first embodiment described above and the same items as those in the first embodiment will not be described.

The resonator according to the third embodiment is the same as the resonator according to the first embodiment described above except the configuration of the support portion and the configuration of the package. The same components as those in the first embodiment described above have the same reference characters.

The support portion of a resonator element 2B has a frame 72, which has a substantially square outer shape and surrounds the base 4, the vibration arms 5 and 6, and a support arm 71B, and the front end of the support arm 71B (end facing away from base 4) is connected to the frame 72, as shown in FIG. 11. The frame 72 is a portion to be bonded to a package 9B.

The package 9B has a box-shaped base 91B, which has a recess 911B that opens upward, and a box-shaped lid 92B, which has a recess 921B that opens downward, and the frame 72 is sandwiched between and bonded to an outer circumferential portion of the base 91B and an outer circumferential portion of the lid 92B, so that the resonator element 2B is fixed to the package 9B, as shown in FIG. 12. Further, a connection terminal 961 (951) provided on the bottom surface of the recess 911B of the base 91B is connected to a predetermined portion of the resonator element 23, for example, with a wire 12 made, for example, of gold.

The third embodiment described above can also provide the same advantageous effects as those provided by the first embodiment described above. In particular, according to the third embodiment, since the resonator element 23 is fixed to the package 9B via the frame 72, the fixing operation can be performed with precision. The size of the resonator element 2B can therefore be increased, whereby R1 of the resonator element 2B can be further reduced.

Fourth Embodiment

A resonator according to a fourth embodiment of the invention will next be described.

Figure 13:
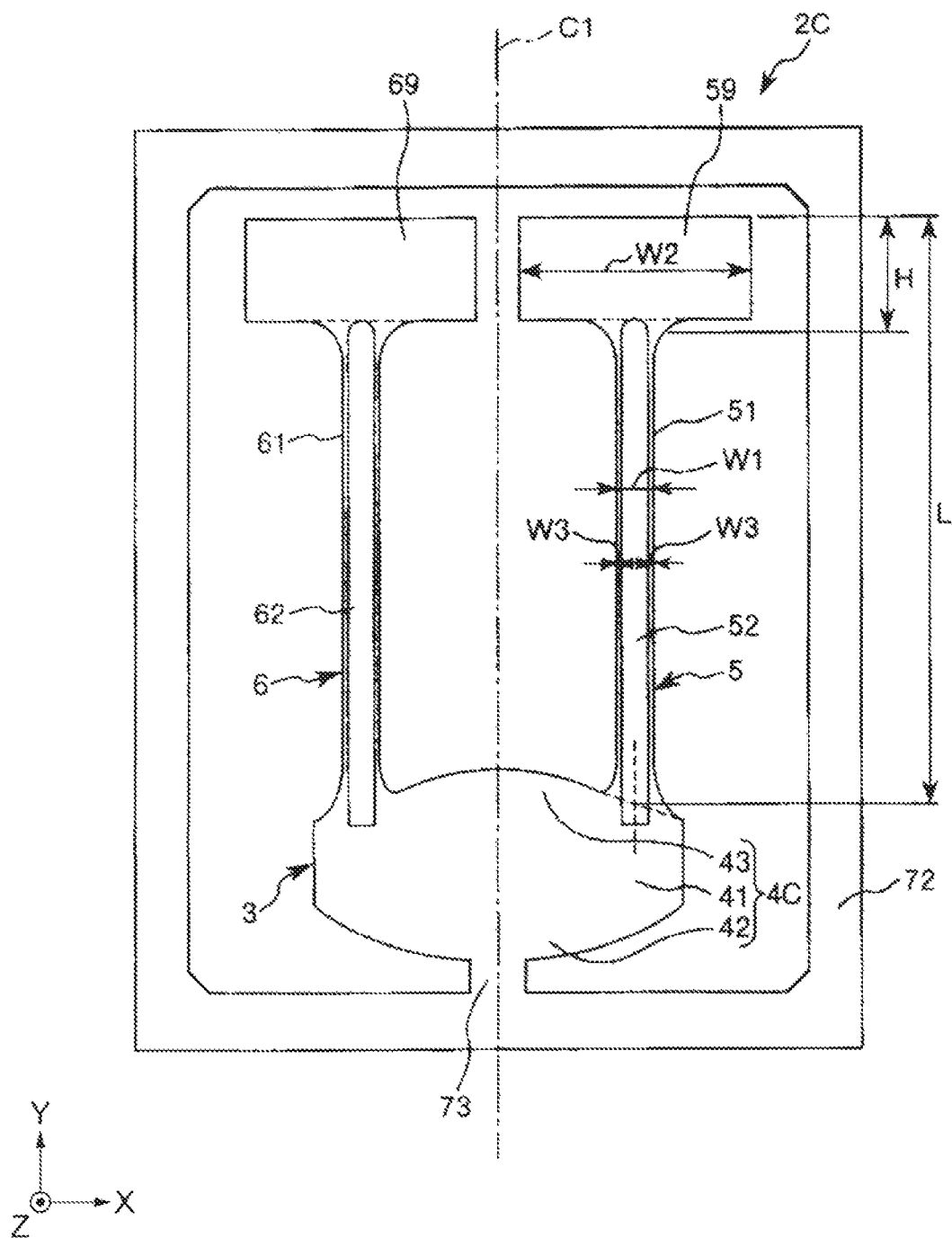
FIG. 13 is a plan view of a resonator element provided in a resonator according to a fourth embodiment of the invention.

FIG. 13 is a plan view of a resonator element provided in the resonator according to the fourth embodiment of the invention.

In the following description, the resonator according to the fourth embodiment will be described primarily about items different from those in the first to third embodiments described above and the same items as those in the first to third embodiments will not be described.

The resonator according to the fourth embodiment is the same as the resonator according to the third embodiment described above except the configuration of the support portion. The same components as those in the third embodiment described above have the same reference characters.

The support portion of a resonator element 2C has, instead of the support arm 71B, a support arm 73, which is located on the base end side of a base 4C (faces away from the pair of vibration arms 5 and 6) and extends along the center line C1, as shown in FIG. 13. The support arm 73 is connected to the frame 72. The base 4C has the same configuration as that of the base 4A in the second embodiment.

The fourth embodiment described above can also provide the same advantageous effects as those provided by the first embodiment described above. In particular, according to the fourth embodiment, since the resonator element 2C is fixed to the package 9 via the frame 72, the fixing operation can be performed with precision. The size of the resonator element 2C can therefore be increased, whereby R1 of the resonator element 2C can be further reduced. Further, according to the fourth embodiment, since the support arm 71B can be omitted, the length (width) of the resonator element 2C along the X-axis direction can be reduced.

Further, the support arm 73 may be omitted and the base 4C may be directly connected to the frame 72, or the frame 72 may be omitted and the resonator element 2C may be fixed to the package 9 via the support arm 73 by using the conductive adhesive 11.

Variation of Resonator Element

Figure 14:
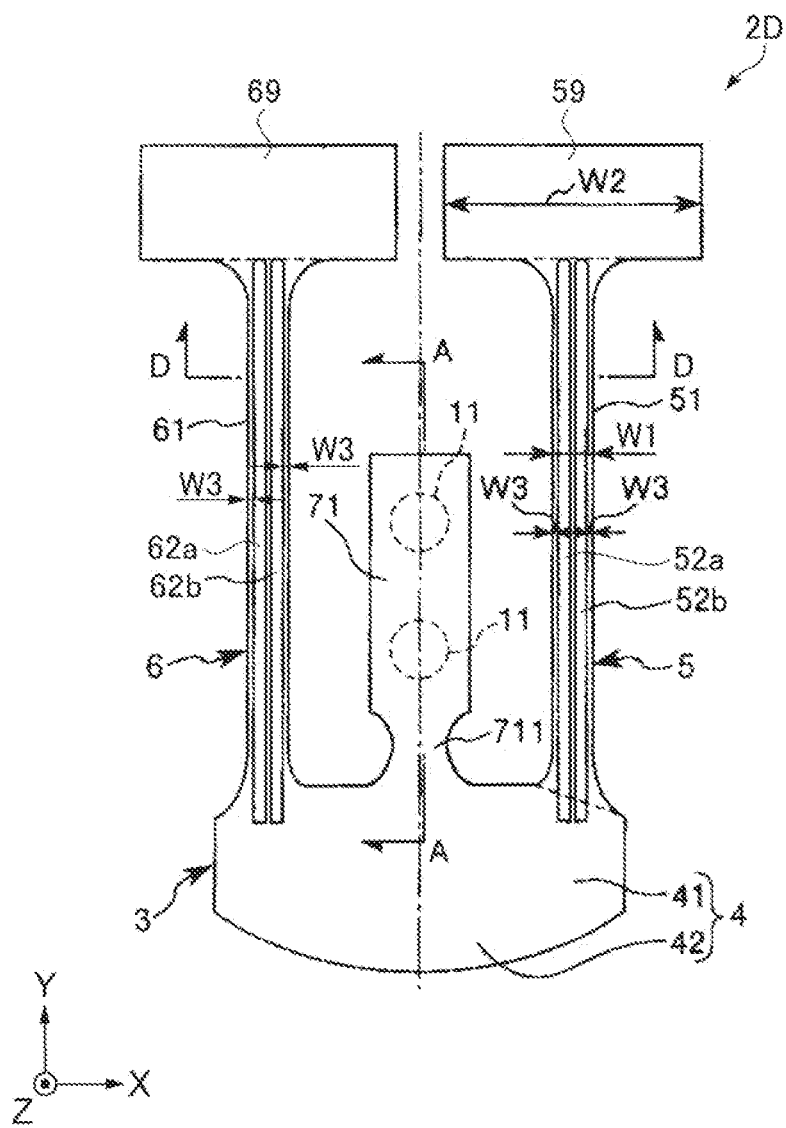
FIG. 14 is a plan view of a resonator element according to a variation.
Figure 15:
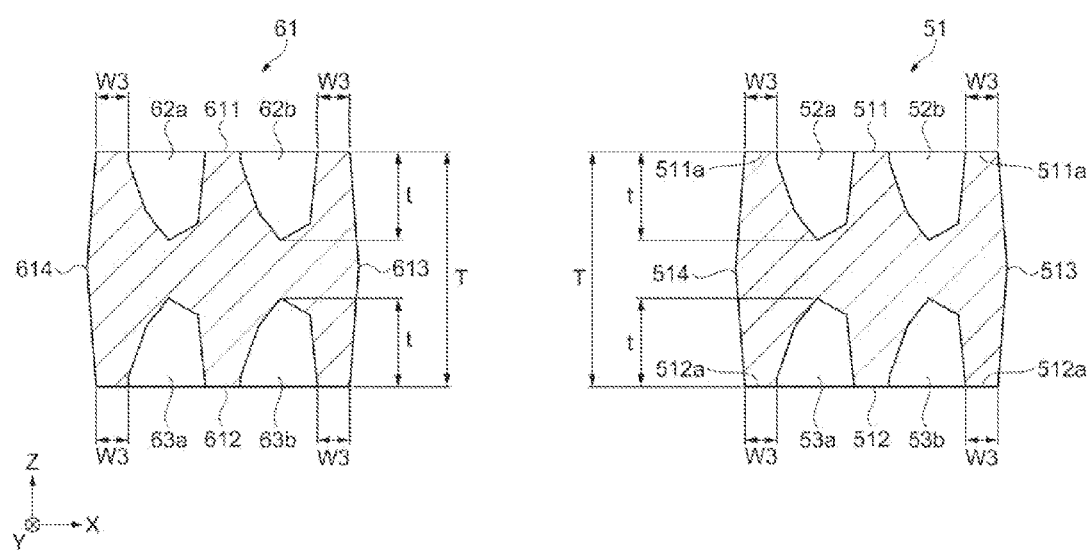
FIG. 15 is a cross-sectional view of the resonator element taken along the line D-D in FIG. 14.

A variation of the resonator elements according to the embodiments of the invention will next be described with reference to FIGS. 14 and 15. FIG. 14 is a plan view showing a variation of the resonator element provided in the resonator according to one of the embodiments of the invention. FIG. 15 shows a cross section of arm portions of the resonator element and is a cross-sectional view of the resonator element taken along the line D-D in FIG. 14.

In the following description, the resonator element according to the variation will be described primarily about items different from those in the first to fourth embodiments described above and the same items as those in the first to fourth embodiments will not be described. In each of the embodiments described above, a single groove is provided through each principal surface of each of the vibration arms, but the number of grooves is not limited to a specific number and may be two or more. For example, two grooves disposed side by side along the X-axis direction may be provided through each principal surface.

The resonator element according to the present variation is the same as the resonator element according to the first embodiment described above except the number of grooves provided through each principal surface of each of the vibration arms. The same components as those in the resonator element according to the first embodiment described above have the same reference characters.

A resonator element 2D according to the variation has two grooves 52a and 52b, each of which has a bottom and is open through one principal surface 511 of the vibration arm 5, two grooves 53a and 53b, each of which has a bottom and is open through the other principal surface 512 of the vibration arm 5, two grooves 62a and 62b, each of which has a bottom and is open through one principal surface 611 of the vibration arm 6, and two grooves 63a and 63b, each of which has a bottom and is open through the other principal surface 612 of the vibration arm 6.

The grooves 52a, 52b, 53a, 53b, 62a, 62b, 63a, and 63b extend in the Y-axis direction and have front ends located at the boundaries between the arm portions 51, 61 and the hammer heads 59, 69 and base ends attached to the base 4. The two grooves 52a and 52b are disposed side by side along the X-axis direction, and the pairs of grooves 53a and 53b, 62a and 62b, and 63a and 63b are similarly disposed side by side.

The thus configured grooves 52b, 53b, 52a, and 53a are so disposed that the width W3 along the X-axis direction between the side surface 513, which is one outer edge of the vibration arm 5, and the edges of the grooves 52b and 53b on the side where the side surface 513 is present and the width W3 along the X-axis direction between the side surface 514, which is the other outer edge of the vibration arm 5, and the edges of the grooves 52a and 53a on the side where the side surface 514 is present are 6 µm or smaller. In the vibration arm 6, the grooves 62b, 63b, 62a, and 63a are disposed in the same manner.

Further, the grooves 52a, 52b, 53a, 53b, 62a, 62b, 63a, and 63b are so configured that η expressed by 2t/T is 0.6 or greater, where t represents the maximum depth of the grooves and T represents the thickness of the vibration arms 5 and 6.

The thus configured grooves 52a, 52b, 53a, 53b, 62a, 62b, 63a, and 63b also allow the thermoelastic loss to be reduced and hence an excellent vibrational characteristic to be provided. The length of each of the grooves 52a, 52b, 53a, 53b, 62a, 62b, 63a, and 63b is not limited to a specific value, and the front end of each of the grooves 52a, 52b, 53a, 53b, 62a, 62b, 63a, and 63b may extend to the area where the corresponding one of the hammer heads 59 and 69 is formed.

In the embodiments and variation described above, the resonator elements are made of quartz crystal but the resonator elements are not necessarily made of quartz crystal and can be made, for example, of aluminumnitride (AlN), lithium niobate (LiNbO$_3$), lithium tantalate (LiTaO$_3$), lead zirconate titanate (PZT), lithium tetraborate (Li$_2$B$_4$O$_7$), Langasite (La$_3$Ga$_5$SiO$_{14}$), or any other oxide substrate, a layered piezoelectric substrate produced by layering aluminum nitride, tantalum pentoxide (Ta$_2$O$_5$), or any other piezoelectric material on a glass substrate, or a piezoelectric ceramic material.

The resonator elements can instead be made of a material other than a piezoelectric material. For example, the resonator elements can be made of a silicon semiconductor material. Further, how to cause the resonator elements to vibrate (how to drive resonator elements) is not limited to a piezoelectric-based driving method using a piezoelectric substrate. A resonator element driven based on an electrostatic drive method using an electrostatic force, a Lorentz drive method using a magnetic force, and other methods as well as a piezoelectric drive method using a piezoelectric substrate can be configured in accordance with the invention and provide advantageous effects thereof. Further, in the specification or the drawings, a term at least once described along with a different term having a broader meaning or the same meaning can be replaced with the different term in any location in the specification or the drawings.

2. Oscillator

A description will next be made of an oscillator (oscillator according to the invention) including the resonator element according to the invention.

Figure 16:
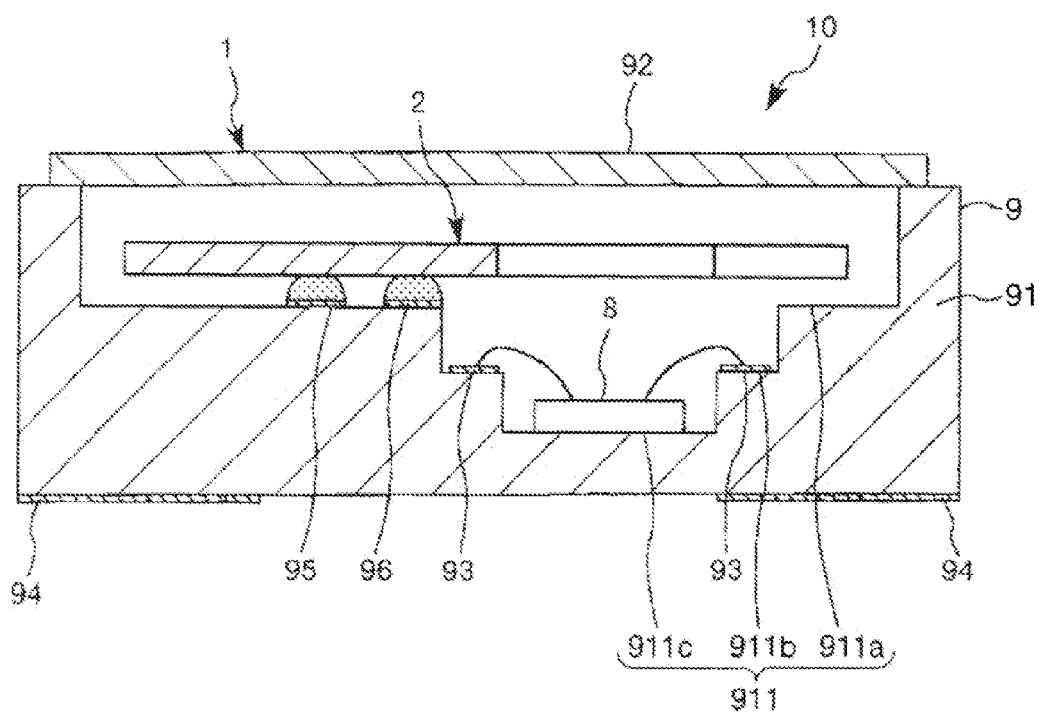
FIG. 16 is a cross-sectional view showing an oscillator according to a preferable embodiment of the invention.

FIG. 16 is a cross-sectional view showing an oscillator according to a preferable embodiment of the invention.

An oscillator 10 shown in FIG. 16 includes the resonator 1 and an IC chip 8 for driving the resonator element 2. The oscillator 10 will be described below primarily about items different from the resonator elements described above and the same items will not be described.

A package 9 has a box-shape base 91, which has a recess 911, and a plate-shaped lid 92, which closes the opening of the recess 911, as shown in FIG. 16. The recess 911 of the base 91 has a first recess 911a that opens through the top surface of the base 91, a second recess 911b that opens through the bottom surface of the first recess 911a, and a third recess 911c that opens through the bottom surface of the second recess 911b.

Connection terminals 95 and 96 are formed on the bottom surface of the first recess 911a. The IC chip 8 is disposed on the bottom surface of the third recess 911c. The IC chip 8 has an oscillation circuit for controlling the drive operation of the resonator element 2. When the IC chip 8 drives the resonator element 2, a predetermined frequency signal can be extracted.

Further, a plurality of inner terminals 93, which are electrically connected to the IC chip 8 with wires, are formed on the bottom surface of the second recess 911b. The plurality of inner terminals 93 include a terminal electrically connected to an outer terminal 94, which is formed on the bottom surface of the package 9, through a via (not shown) formed in the base 91, a terminal electrically connected to the connection terminal 95 through a via or a wire (not shown), and a terminal electrically connected to the connection terminal 96 through a via or a wire (not shown).

The configuration shown in FIG. 16 has been described with reference to the configuration in which the IC chip 8 is disposed in an accommodation space, but the IC chip 8 is not necessarily disposed at a specific location and may, for example, be disposed outside the package 9 (on the bottom surface of the base 91).

3. Electronic Apparatus

A description will next be made of an electronic apparatus (electronic apparatus according to the invention) including the resonator element according to the invention.

Figure 17:
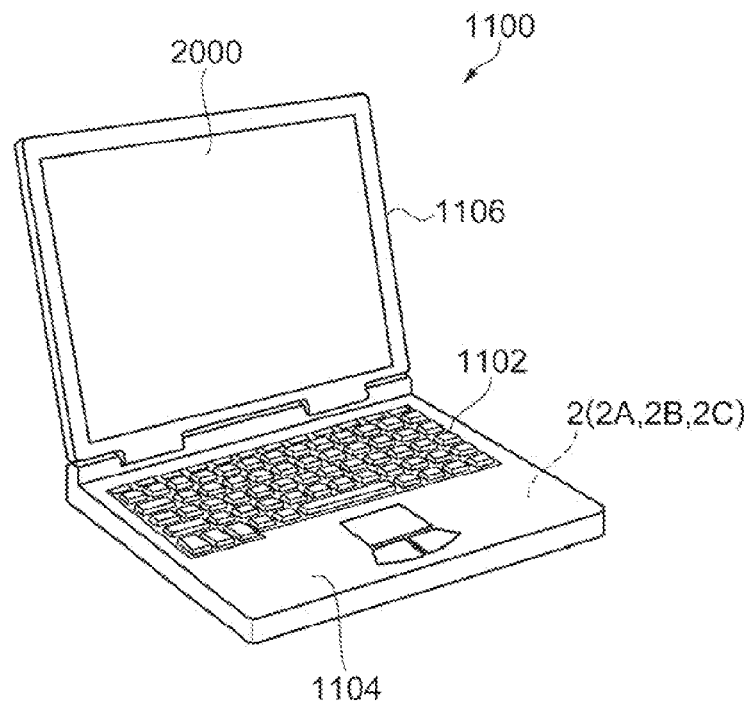
FIG. 17 is a perspective view showing the configuration of a mobile (or notebook) personal computer as an example of an electronic apparatus including the resonator element according to the invention.

FIG. 17 is a perspective view showing the configuration of a mobile (or notebook) personal computer as an electronic apparatus including the resonator element according to the invention in FIG. 17, a personal computer 1100 is formed of the following components: a body 1104 including a keyboard 1102; and a display unit 1106 including a display section 2000, and the display unit 1106 is so supported by the body 1104 via a hinge structure that the display unit 1106 is pivotal relative to the body 1104. The thus configured personal computer 1100 accommodates the resonator element 2 (2A to 2C), which functions as a filter, a resonator, a reference clock, or any other component.

Figure 18:
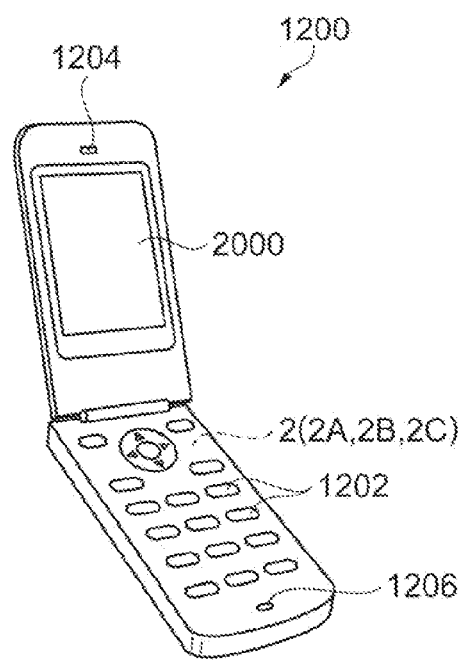
FIG. 18 is a perspective view showing the configuration of a mobile phone (including PHS) as an example of an electronic apparatus including the resonator element according to the invention.

FIG. 18 is a perspective view showing the configuration of a mobile phone (including PHS) as an electronic apparatus including the resonator element according to the invention. In FIG. 18, a mobile phone 1200 includes a plurality of operation buttons 1202, a receiver 1204, and a transmitter 1206, and a display section 2000 is disposed between the operation buttons 1202 and the receiver 1204. The thus configured mobile phone 1200 accommodates the resonator element 2 (2A to 2C), which functions as a filter, a resonator, or any other component.

Figure 19:
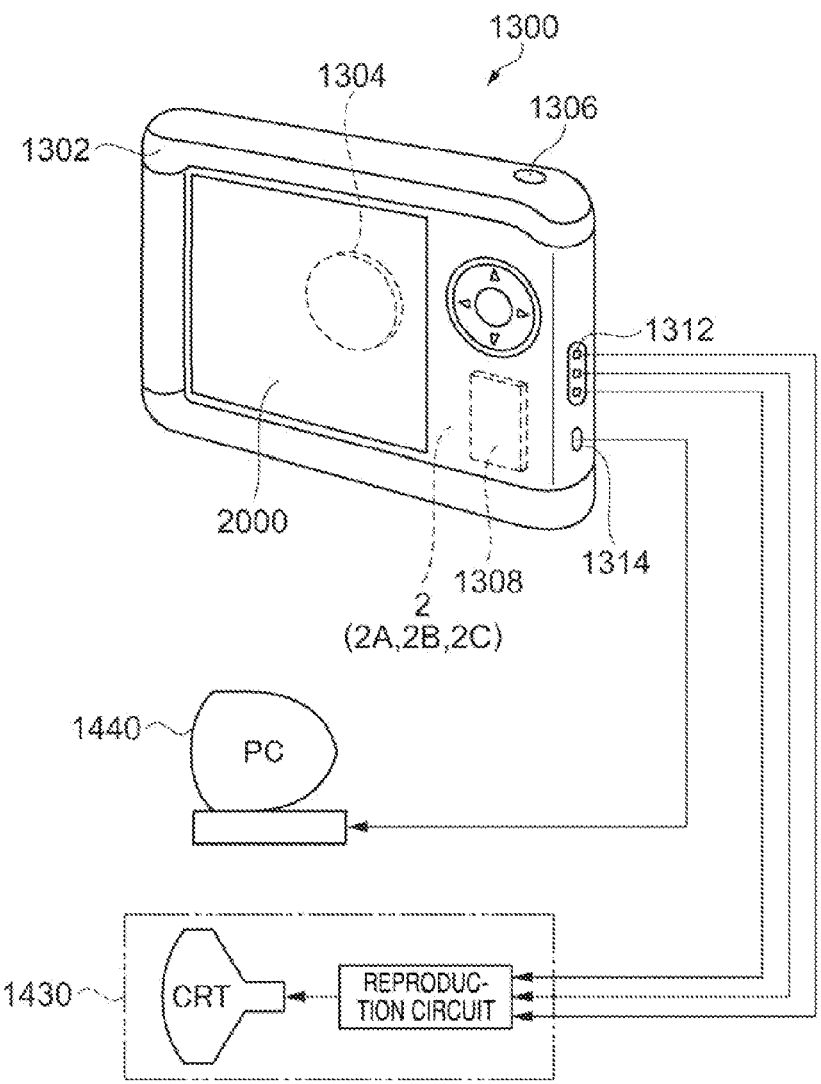
FIG. 19 is a perspective view showing the configuration of a digital still camera as an example of an electronic apparatus including the resonator element according to the invention.

FIG. 19 is a perspective view showing the configuration of a digital still camera as an electronic apparatus including the resonator element according to the invention. FIG. 19 also schematically shows connection to external apparatus. In a typical camera, a silver photographic film is exposed to light, specifically to an optical image of a subject, whereas a digital still camera 1300 converts an optical image of a subject into a captured image signal (image signal) in a photoelectric conversion process by using a CCD (charge coupled device) or any other imaging device.

A display section 2000 is provided on the rear side of a case (body) 1302 of the digital still, camera 1300 and displays an image based on the captured image signal from the CCD. The display section 2000 thus functions as a finder that displays a subject in the form of an electronic image. Further, a light receiving unit 1304 including an optical lens (imaging system), the CCD, and other components is provided on the front side (rear side in FIG. 19) of the case 1302.

When a user of the camera checks a subject image displayed on the display section 2000 and presses a shutter button 1306, a captured image signal from the CCD at that point of time is transferred to and stored in a memory 1308. Further, in the digital still camera 1300, a video signal output terminal 1312 and a data communication input/output terminal 1314 are provided on a side surface of the case 1302. The video signal output terminal 1312 is connected to a television monitor 1430 as necessary, and the data communication input/output terminal 1314 is connected to a personal computer 1440 as necessary, as shown in FIG. 19. Further, in response to predetermined operation, a captured image signal stored in the memory 1308 is outputted to the television monitor 1430 or the personal computer 1440. The thus configured digital still camera 1300 accommodates the resonator element 2 (2A to 2C), which functions as a filter, a resonator, or any other component.

An electronic apparatus including the resonator element according to the invention is used not only in the personal computer (mobile personal computer) shown in FIG. 17, the mobile phone shown in FIG. 18, and the digital still camera shown in FIG. 19 but also, for example, in an inkjet-type liquid ejection apparatus (inkjet printer, for example), a laptop personal computer, a television receiver, a video camcorder, a video tape recorder, a car navigation system, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in vehicles, air planes, and ships), and a flight simulator.

4. Physical Quantity Sensor

Figure 20:
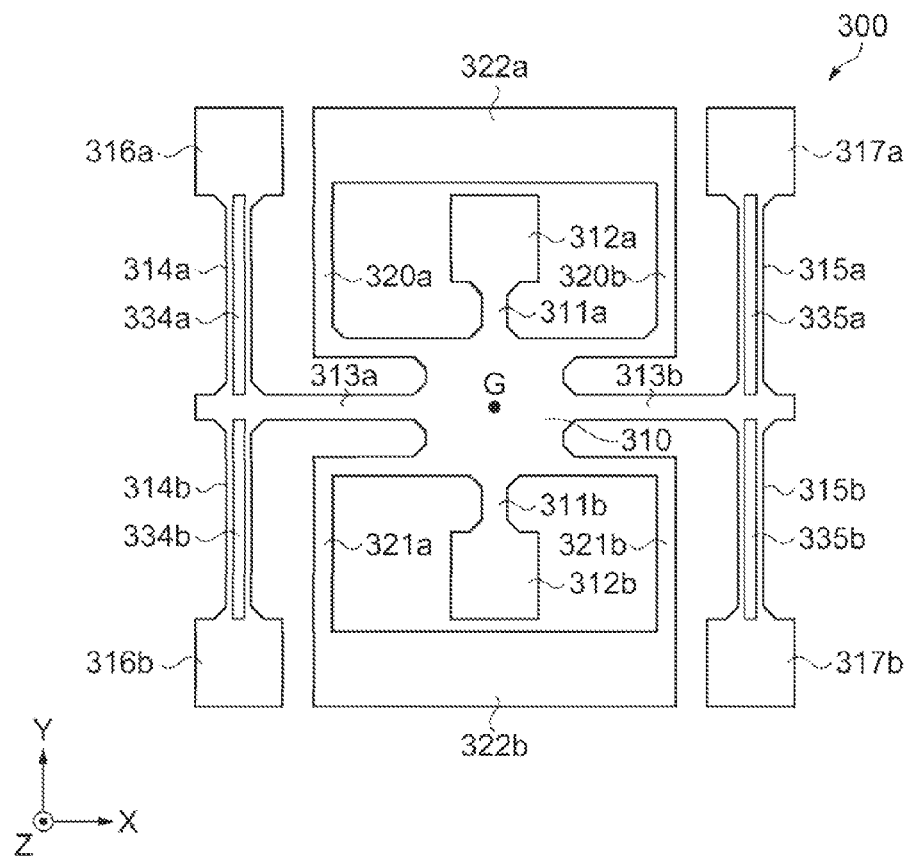
FIG. 20 is a plan view of a resonator element provided in a physical quantity sensor as a sensor according to the invention.
Figure 21:
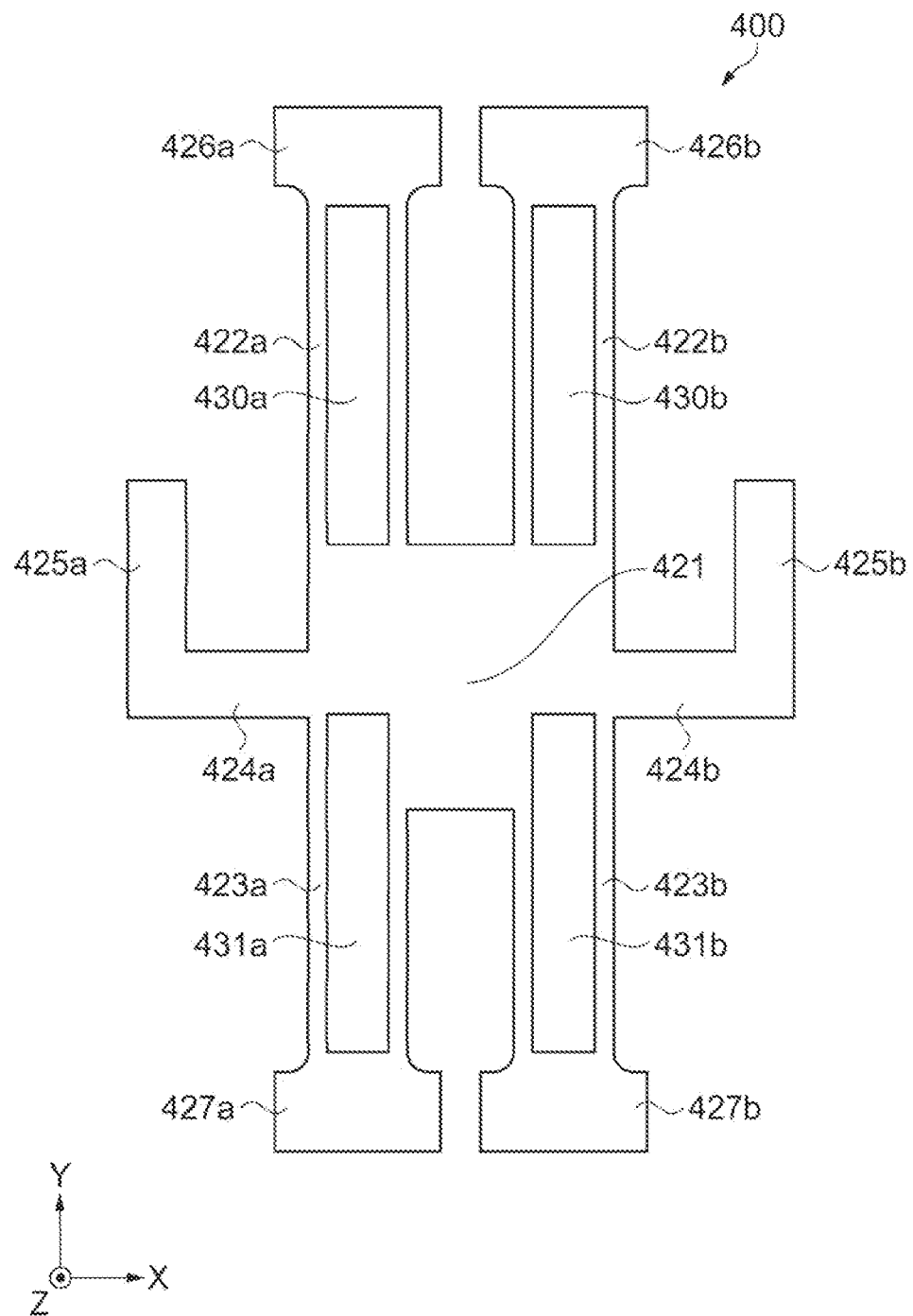
FIG. 21 is a plan view of another resonator element provided in a physical quantity sensor as a sensor according to the invention.

The resonator element according to the invention can be used as a variety of physical quantity sensors, such as a gyro sensor, a pressure sensor, an acceleration sensor, and an inclination sensor. For example, a gyro device incorporated in a gyro sensor is, for example, what is called a double-T-shaped gyro device or what is called an H-shaped gyro device. A double-T-shaped gyro device and an H-shaped gyro device will be described below with reference to FIGS. 20 and 21. FIG. 20 is a plan view of a resonator element (double-T-shaped gyro device) provided in a gyro sensor, which is an example of the physical quantity sensor. FIG. 21 is a plan view of a resonator element (H-shaped gyro device).

Double-T-Shaped Gyro Device

A gyro device 300, which is a double-T-shaped gyro device, shown in FIG. 20 is made of quartz crystal. Quartz crystal has an X axis called an electrical axis, a Y axis called a mechanical axis, and a Z axis called an optical axis. The vibration gyro device 300 has a predetermined thickness in the Z-axis direction and is formed in an XY plane.

The gyro device 300 has a pair of detection vibration arms 311$a$ and 311$b$, which linearly extend from a base 310 upward and downward in FIG. 20, a pair of connection arms 313$a$ and 313$b$, which extend from the base 310 rightward and leftward in FIG. 20 in the directions perpendicular to the detection vibration arms 311$a$ and 311$b$, and right and left pairs of drive vibration arms 314$a$, 314$b$, 315$a$, 315$b$, which extend from front end portions of the connection arms 313$a$ and 313$b$ upward and downward in FIG. 20 in parallel to the detection vibration arms 311$a$ and 311$b$.

The drive vibration arms 314$a$, 314$b$, 315$a$, and 315$b$ have grooves 334$a$, 334$b$, 335$a$, and 335$b$ provided therein, which have bottoms and open through principal surfaces of the drive vibration arms 314$a$, 314$b$, 315$a$, and 315$b$. The grooves 335$a$, 335$b$, 334$a$, and 334$b$ extend in the Y-axis direction and have front ends located at the boundaries between the drive vibration arms 314$a$, 314$b$, 315$a$, 315$b$ and weight portions 316$a$, 316$b$, 317$a$, 317$b$, which will be described later, and base ends located at the boundaries between the drive vibration arms 314$a$, 314$b$, 315$a$, 315$b$ and the connection arms 313$a$, 313$b$. The grooves 334$a$, 334$b$, 335$a$, and 335$b$ may also be so provided that they are open through principal surfaces on the rear side as well as those that open through the principal surfaces on the front side described above.

Providing the grooves 334$a$, 334$b$, 335$a$, and 335$b$ as described above allows thermoelastic loss to be reduced and hence an excellent vibrational characteristic to be provided.

Further, detection electrodes (not shown) are formed on the surfaces of the detection vibration arms 311$a$ and 311$b$, and drive electrodes (not shown) are formed on the surfaces of the drive vibration arms 314$a$, 314$b$, 315$a$, and 315$b$. The thus configured detection vibration arms 311$a$ and 311$b$ form a detection vibration system that detects an angular velocity, and the thus configured connection arms 313$a$ and 313$b$ and drive vibration arms 314$a$, 314$b$, 315$a$, 315$b$ form a drive vibration system that drives the gyro device 300.

Weight portions 312$a$ and 312$b$ are formed at the front ends of the detection vibration arms 311$a$ and 311$b$, and weight portions 316$a$, 316$b$, 317$a$, and 317$b$ are formed at the front ends of the drive vibration arms 314$a$, 314$b$, 315$a$, and 315$b$. The weight portions are intended to improve angular velocity detection sensitivity. The detection vibration arms 311$a$ and 311b are collective names including the weight portions 312a and 312b, and the drive vibration arms 314a, 314b, 315a, and 315b are collective names including the weight portions 316a, 316b, 317a, and 317b.

Further, the detection vibration arms 311a and 311b are formed to be shorter than the drive vibration arms 314a, 314b, 315a, and 315b.

Further, a pair of L-shaped beams 320a and 320b are formed. The beams 320a and 320b extend from the base 310 rightward and leftward in FIG. 20 in the directions perpendicular to the detection vibration arm 311.a and are then redirected and extend in parallel to the detection vibration arm 311a, and the front ends of the beams 320a and 320b are connected to a support portion 322a. Similarly, a pair of L-shaped beams 321a and 321b are formed. The beams 321a and 321b extend from the base 310 rightward and leftward in FIG. 20 in the directions perpendicular to the detection vibration arm 311b and are redirected and then extend in parallel to the detection vibration arm 311b, and the front ends of the beams 321a and 321b are connected to a support portion 322b.

The pair of support portions 322a and 322b are disposed in regions beyond the extending detection vibration arms 311a and 311b and between drive vibration arms 314a, 314b, 315a, 315b. The pair of support portions 322a and 322b are further so disposed that they are rotationally symmetric with respect to the center of gravity G of the gyro device 300.

H-Shaped Gyro Device

A gyro device 400, which is an H-shaped gyro device, shown in FIG. 21 includes a base 421, drive vibration arms 422a and 422b, detection vibration arms 423a and 423b, and adjustment vibration arms 425a and 425b.

The gyro device 400 is made of quartz crystal. Quartz crystal has an X axis called an electrical axis, a Y axis called a mechanical axis, and a Z axis called an optical axis. The gyro device 400 is formed of what is called a quartz crystal Z plate produced by cutting a quartz crystal block along a plane defined by the X and Y axes perpendicular to each other at a quartz crystal crystalline axis and shaping the cut quartz crystal into a flat plate having a predetermined thickness in the Z-axis direction perpendicular to the cutting plane. The predetermined thickness is set as appropriate based, for example, on the oscillation frequency (resonant frequency), the size of the exterior shape, and the processability.

The gyro device 400 includes a base 421, which is a central portion having a substantially rectangular shape, a pair of drive vibration arms 422a and 422b, which extend along the Y axis in parallel to each other from one of the ends of the base 421 in the Y-axis direction (the end in the +Y direction in FIG. 21), and a pair of detection vibration arms 423a and 423b, which extend along the Y axis in parallel to each other from the other end of the base 421 (the end in the −Y direction in FIG. 21). The gyro device 400 is called an H-shaped gyro device (H-shaped vibration piece) in some cases because it is so shaped that the pair of drive vibration arms 422a and 422b and the pair of detection vibration arms 423a and 423b coaxially extend from two ends of the base 421 as described above. The gyro device 400 is characterized by stable detection sensitivity because the configuration in which the drive vibration arms 422a and 422b and the detection vibration arms 423a and 423b coaxially extend from the two ends of the base 421 allows the drive system and the detection system to be separate from each other, which reduces the amount of electrostatic coupling between electrodes or wirings of the drive and detection systems. In the present example, two drive vibration arms and two detection vibration arms are provided, but the number of vibration arms may be one or three or more.

Further, a drive electrode and a detection electrode may be formed on a single vibration arm.

The drive vibration arms 422a and 422b and the detection vibration arms 423a and 423b have grooves 430a, 430b, 431a, and 431b provided therein, which have bottoms and open through principal surfaces of the drive vibration arms 422a and 422b and the detection vibration arms 423a and 423b. The grooves 430a, 430b, 431a, and 431b extend in the Y-axis direction and have front ends located at the boundaries between the drive vibration arms 422a, 422b, the detection vibration arms 423a, 423b and weight portions 426a, 426b, 427a, 427b, which will be described later, and base ends located at the boundaries between the drive vibration arms 422a, 422b, the detection vibration arms 423a, 423b and the base 421. The grooves 430a, 430b, 431a, and 431b may also be so provided that they are open through principal surfaces on the rear side as well as the principal surfaces on the front side described above.

Providing the grooves 430a, 430b, 431a, and 431b as described above allows thermoelastic loss to be reduced and hence an excellent vibrational characteristic to be provided.

Weight portions 426a and 426b are provided at the front ends of the drive vibration arms 422a and 422b, and weight portions 427a and 427b are provided at the front ends of the detection vibration arms 423a and 423b. The weight portions are intended to improve angular velocity detection sensitivity and shorten the drive vibration arms 422a and 422b and the detection vibration arms 423a and 423b for reduction of the size of the gyro device 400. The drive vibration arms 422a and 422b are collective names including the weight portions 426a and 426b, and the detection vibration arms 423a and 423b are collective names including the weight portions 427a and 427b.

The gyro device 400 further has a pair of adjustment vibration arms 425a and 425b, which extend in directions that intersect the crystalline X axis (electrical axis) of the quartz crystal. In the gyro device 400, the adjustment vibration arms 425a and 425b are so provided that they extend in parallel to the drive vibration arms 422a and 422b from front end portions of a pair of connection arms 424a and 424b, which extend along the X axis from two ends of the base 421 in the directions perpendicular to the drive vibration arms 422a and 422b and the detection vibration arms 423a and 423b (two ends in X-axis direction). That is, the adjustment vibration arms 425a and 425b extend from front end portions of the connection arms 424a and 424b along the Y axis (in +Y direction).

The adjustment vibration arms 425a and 425b are so formed that they have overall lengths shorter than those of the drive vibration arms 422a and 422b and the detection vibration arms 423a and 423b. As a result, vibration of the adjustment vibration arms 425a and 425b for adjusting a leakage output will not hinder major vibration of the gyro device 400 produced by first vibration arms (drive vibration arms and detection vibration arms), which advantageously allows a stable vibrational characteristic of the gyro device 400 to be provided and the size of the gyro device 400 to be reduced.

The center of the base 421 can be the center of gravity of the gyro device 400. It is assumed that the X, Y, and Z axes are perpendicular to each other and pass through the center of gravity. The exterior shape of the gyro device 400 can be symmetric with respect to an imaginary center line passing through the center of gravity in the Y-axis direction. The gyro device 400 therefore has a well-balanced exterior shape, which is preferable because the gyro device 400 has stable characteristics and hence improved detection sensitivity.

The exterior shape of the thus configured gyro device 400 can be formed in an etching (wet or dry etching) process using a photolithography technology. A plurality of gyro devices 400 can be manufactured from a single quartz crystal wafer.

5. Moving Object

A description will next be made of a moving object (moving object according to the invention) including the resonator element according to the invention.

Figure 22:
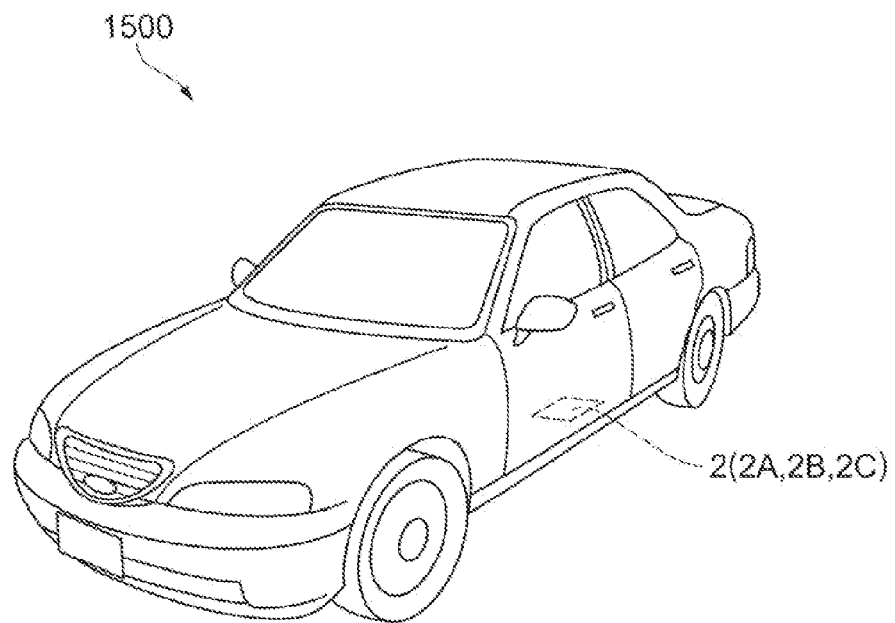
FIG. 22 is a perspective view schematically showing an automobile as an example of a moving object according to the invention.

FIG. 22 is a perspective view schematically showing an automobile as an example of the moving object according to the invention. An automobile 1500 accommodates the resonator element 2. The resonator element 2 (2A to 2C) can be widely used as a keyless entry system, an immobilizer, a car navigation system, a car air conditioner, an anti-lock braking system (ABS), an airbag, a tire pressure monitoring system (TPMS), an engine control system, an apparatus that monitors a battery in a hybrid automobile and an electric automobile, a vehicle body attitude control system, or any other electronic control unit (ECU).

The resonator element, the resonator, the oscillator, the electronic apparatus, and the moving body according to the illustrated embodiments of the invention have been described, but the invention is not limited thereto and the configuration of each component can be replaced with an arbitrary configuration having the same function. Further, any other arbitrary component may be added to the invention. Moreover, the embodiments may be combined to each other as appropriate.

The entire disclosure of Japanese Patent Application No. 2013-075412, filed Mar. 29, 2013, and Japanese Patent Application No. 2014-021140, filed Feb. 6, 2014 is expressly incorporated by reference herein.

What is claimed is:

1. A resonator element comprising:

a base; and at least one vibration arm that extends from the base in a first direction in a plan view and has a groove provided in at least one of a pair of principal surfaces that face away from each other and form front and rear surfaces, wherein in the principal surface of the vibration arm in the plan view, each of a plurality of widths W3 along a second direction perpendicular to the first direction between one outer edge of the vibration arm and an edge of the groove on the side where the one outer edge is present and a width along the second direction between the other outer edge of the vibration arm and an edge of the groove on the side where the other outer edge is present is 6 μm or smaller, the vibration arm including:

a weight portion, and an arm portion disposed between the weight portion and the base in the plan view, the vibration arm satisfies a relationship $0.012 < H/L < 0.3$, where L represents an overall length of the vibration arm in the first direction and H represents a length of the weight portion in the first direction, the vibration arm satisfies a relationship $1.5 \leq W2/W1 \leq 10.0$, where W1 represents a width of the arm portion in the second direction and W2 represents a width of the weight portion in the second direction, with W1 being 100 μm or smaller, and at least on of the widths W3 is in the range of 1 μm to 3 μm.

2. The resonator element according to claim 1, wherein η expressed by $2t/T$ is 0.6 or greater where t represents a maximum depth of the groove and T represents the thickness of the vibration arm.

3. The resonator element according to claim 1, wherein the thickness of the vibration arm is at least 50 μm.

4. The resonator element according to claim 1, wherein the weight portion is an increased width portion that is longer than the arm portion in the second direction.

5. The resonator element according to claim 1, further comprising a support portion that extends from the base.

6. The resonator element according to claim 5, wherein the vibration arm is formed of a pair of vibration arms disposed side by side along the second direction, and the support portion is disposed between the pair of vibration arms in the plan view and extends from the base along the first direction.

7. The resonator element according to claim 5, wherein the support portion includes a frame that surrounds at least the base and the vibration arms in the plan view.

8. The resonator element according to claim 1, wherein the base includes a reduced width portion provided on at least one of a first end side on the first direction side and a second end side on a counter direction side to the first direction in the plan view and so configured that the length of the reduced width portion along the second direction decreases continuously or stepwise along the first direction from the inner side toward the outer side of the base.

9. A resonator comprising:

the resonator element according to claim 1; and a package in which the resonator element is incorporated.

10. An oscillator comprising:

the resonator element according to claim 1; and an oscillation circuit.

11. An electronic apparatus comprising the resonator element according to claim 1.

12. A sensor comprising the resonator element according to claim 1.

13. A moving object comprising the resonator element according to claim 1.

* * * * *